(12) United States Patent
Hosono

(10) Patent No.: US 9,536,615 B2
(45) Date of Patent: Jan. 3, 2017

(54) NONVOLATILE SEMICONDUCTOR MEMORY DEVICE AND CONTROL METHOD THEREOF

(71) Applicant: KABUSHIKI KAISHA TOSHIBA, Tokyo (JP)

(72) Inventor: Koji Hosono, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/849,558

(22) Filed: Sep. 9, 2015

(65) Prior Publication Data

US 2015/0380100 A1 Dec. 31, 2015

Related U.S. Application Data

(63) Continuation of application No. 13/784,753, filed on Mar. 4, 2013, now Pat. No. 9,165,651.

(30) Foreign Application Priority Data

Sep. 24, 2012 (JP) ................................. 2012-209400

(51) Int. Cl.
*G11C 16/26* (2006.01)
*G11C 16/04* (2006.01)
(Continued)

(52) U.S. Cl.
CPC ........... *G11C 16/26* (2013.01); *G11C 11/5642* (2013.01); *G11C 16/0408* (2013.01); *G11C 16/0483* (2013.01); *G11C 16/08* (2013.01)

(58) Field of Classification Search
None
See application file for complete search history.

(56) References Cited

U.S. PATENT DOCUMENTS 6,937,510 B2 8/2005 Hosono et al.
2009/0010074 A1* 1/2009 Shirota et al. ........... 365/185.25
(Continued)

FOREIGN PATENT DOCUMENTS

JP 2010-103255 A 5/2010
JP 2010102755 A 5/2010
JP 2010118530 A 5/2010

OTHER PUBLICATIONS

Japanese Office Action dated Feb. 17, 2015 in counterpart Japanese Patent Application 2012-209400 (with English translation).
(Continued)

*Primary Examiner* — Shawki S Ismail
*Assistant Examiner* — Muhammad S Islam
(74) *Attorney, Agent, or Firm* — Patterson & Sheridan, LLP

(57) ABSTRACT

A nonvolatile semiconductor memory device includes a memory cell array having first and second groups of memory strings, each memory string including first and second memory cells connected between select transistors. The nonvolatile semiconductor memory device further includes a first word line connected to the first memory cells of the memory strings, a second word line connected to the second memory cells of the memory strings, and a control unit configured to control application of control voltages to the select transistors and the word lines, such that a select line voltage is applied to the first word line and a non-select line voltage is applied to the second word line and not discharged while select transistors of the first group of memory strings are turned off and select transistors of the second group of memory strings are turned on.

20 Claims, 12 Drawing Sheets

(51) Int. Cl.
  *G11C 11/56* (2006.01)
  *G11C 16/08* (2006.01)

(56) References Cited

U.S. PATENT DOCUMENTS

| | | |
|---|---|---|
| 2009/0268524 A1 | 10/2009 | Maejima |
| 2010/0037007 A1 | 2/2010 | Futatsuyama et al. |
| 2010/0097858 A1 | 4/2010 | Tokiwa et al. |
| 2010/0118610 A1 | 5/2010 | Katsumata et al. |
| 2010/0277979 A1* | 11/2010 | Kang et al. ............... 365/185.03 |
| 2011/0051527 A1* | 3/2011 | Kirisawa et al. ......... 365/185.29 |
| 2012/0044771 A1* | 2/2012 | Joo .......................... 365/185.22 |
| 2012/0069663 A1* | 3/2012 | Itagaki et al. ............ 365/185.11 |
| 2014/0085983 A1* | 3/2014 | Hosono ..................... 365/185.17 |

OTHER PUBLICATIONS

Taiwanese Office Action dated Mar. 25, 2015 in counterpart Taiwanese Patent Application 102113186.

\* cited by examiner

NONVOLATILE SEMICONDUCTOR MEMORY DEVICE AND CONTROL METHOD THEREOF

CROSS-REFERENCE TO RELATED APPLICATION

This application is a continuation of U.S. patent application Ser. No. 13/784,753, filed Mar. 4, 2013, which is based upon and claims the benefit of priority from Japanese Patent Application No. 2012-209400, filed Sep. 24, 2012; the entire contents of both applications are incorporated herein by reference.

FIELD

Embodiments described herein relate generally to a nonvolatile semiconductor memory device and its control method.

BACKGROUND

In recent years, a stacked type of semiconductor memory having stacked memory cells (e.g., BiCS: Bit Cost Scalable Flash Memory) has been developed. With this BiCS, a low cost and high capacity semiconductor memory can be achieved.

DETAILED DESCRIPTION

Figure 1:
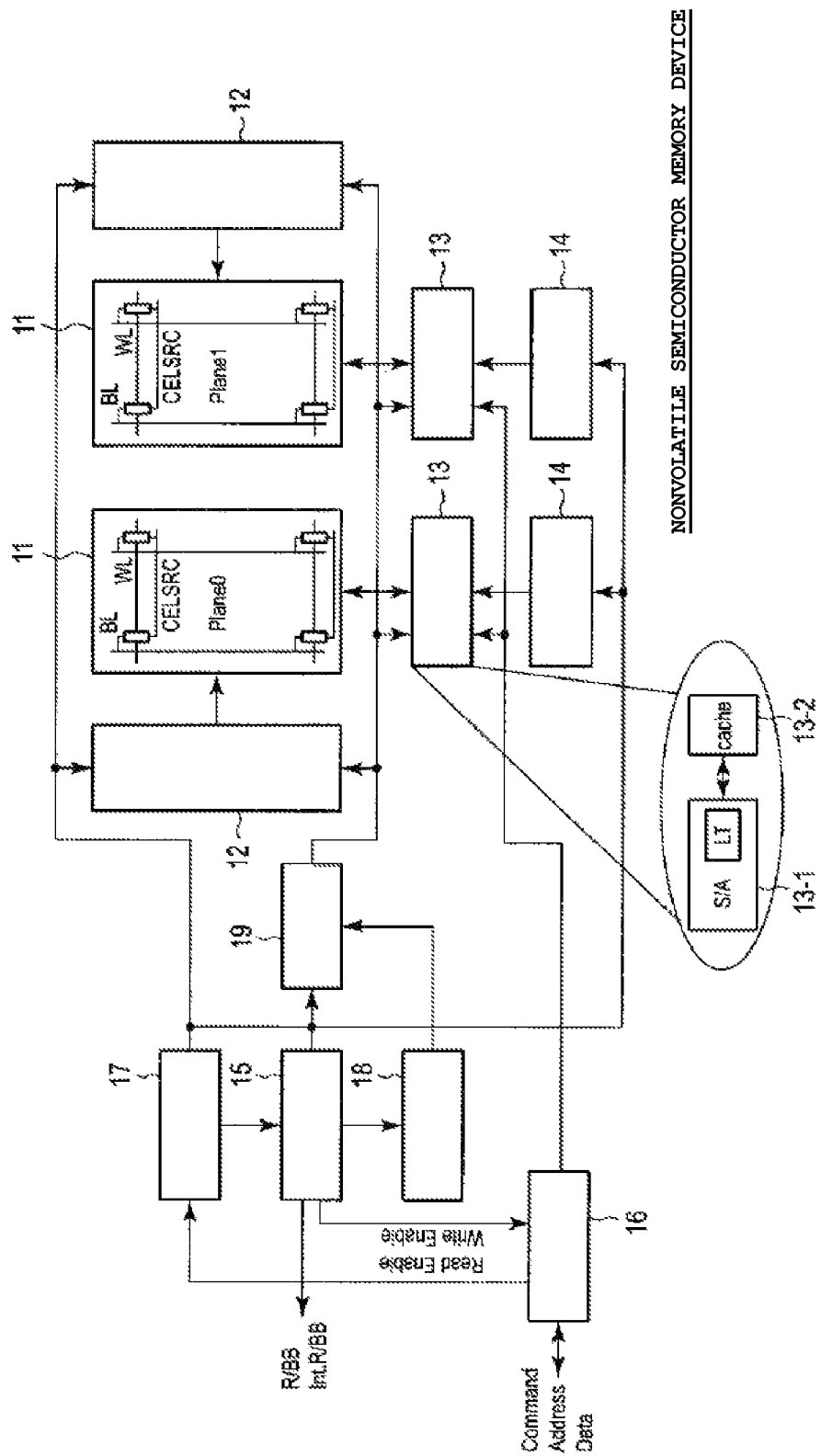
FIG. 1 is an example of a complete configuration of a nonvolatile semiconductor memory device of a first embodiment.

Embodiments provide a nonvolatile semiconductor memory device capable of high speed read operation and a method of controlling such a nonvolatile semiconductor memory device.

In general, embodiments are described with reference to the drawings. With respect to this explanation, the same signs will be used for the same components that are common in all the figures. The drawings are schematic diagrams, and it should be noted that the relationship between the thickness and planar dimensions and the ratio of the thickness of each layer may different from the actual ones.

A nonvolatile semiconductor memory device, according to an embodiment, includes a memory cell array having first and second groups of memory strings, each memory string including first and second memory cells connected between select transistors. The nonvolatile semiconductor memory device further includes a first word line connected to the first memory cells of the memory strings, a second word line connected to the second memory cells of the memory strings, and a control unit configured to control application of control voltages to the select transistors and the word lines, such that a select line voltage is applied to the first word line and a non-select line voltage is applied to the second word line and not discharged while select transistors of the first group of memory strings are turned off and select transistors of the second group of memory strings are turned on.

The embodiment explained below makes use of the structure in which a word line WL commonly connects to each memory string. During a read operation, the amount of charging and discharging of the word line WL is reduced to increase the speed of the read operation and suppress power consumption.

First Embodiment

Example of a Complete Configuration

This nonvolatile semiconductor memory device is structured in such a way that it has the commands that support various operations such as reading, writing and deleting from a host device (not shown in the drawing) of a memory controller that exchanges the data with this device, address information in order to read and write the data at the desired location, as well as ability to operate after receiving a timing signal for the input and output of these data.

First, the complete configuration of the nonvolatile semiconductor memory device of the first embodiment will be explained with reference to FIG. 1. FIG. 1 is the block diagram of the nonvolatile semiconductor memory device of the first embodiment.

As shown in FIG. 1, the nonvolatile semiconductor memory device of the first embodiment is provided with a memory cell 11, a row decoder 12, a data circuit and page buffer 13, a column decoder 14, a control circuit 15, an input and output circuit 16, an address and command register 17, an internal voltage generating circuit 18 and a core driver 19.

<Memory Cell Array 11>

As shown in FIG. 1, the memory cell array 11 is provided with, for example, plane P0 and plane P1 (shown as plane 0 and plane 1 in FIG. 1). These plane P0 and plane P1 are provided with multiple memory strings MC. The memory strings MS are electrically connected to a bit line BL and a source line CELSRC. The memory strings MS are provided with multiple memory cells MS. The word line WL is electrically connected to the control gate of the memory cells MC. There is no restriction on the number of planes P configured in the memory cell array 11. Furthermore, if plane P0 and plane P1 are not differentiated, it will be simply expressed as P.

In the following, the detailed structure of plane P will be explained using FIG. 2.

<Detailed Structure of Plane P>

Figure 2:
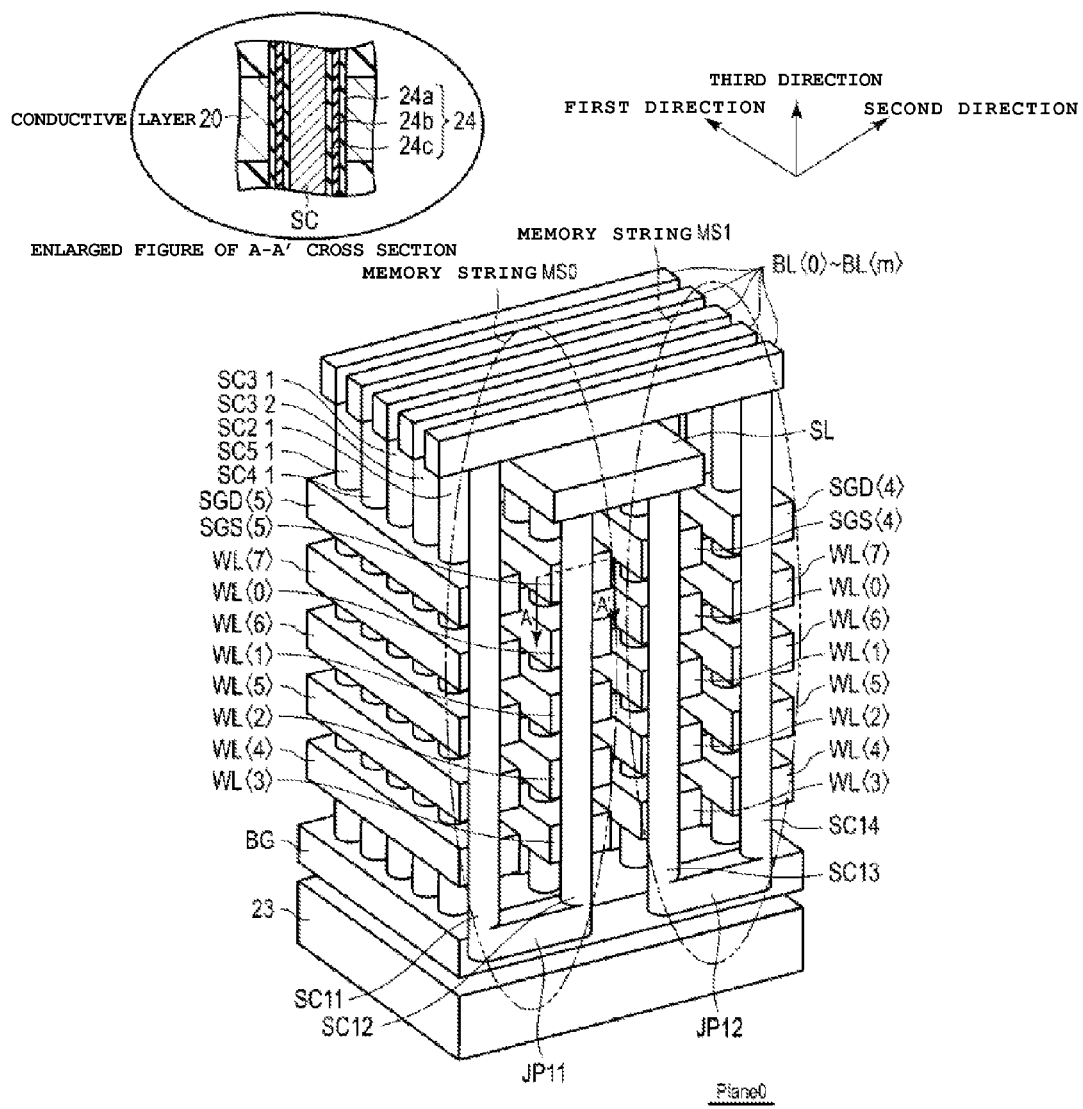
FIG. 2 is the isometric view of a memory cell array and a perspective drawing of the memory cell of the first embodiment.

FIG. 2 is a 3D isometric view of the structure of plane P. The structure of the plane P shown here is the same for both plane P0 and plane P1. Explanation is given on plane P0 as an example.

As shown in FIG. 2, a columnar semiconductor layer SC matrix (5×4) is formed within the plane formed by a first direction and a second direction. This semiconductor layer SC is on top of a back gate layer BG and is formed along a third direction which is orthogonal to the first direction and the second direction respectively. In addition, the semiconductor layers SC which is mutually adjacent to each other and along the second direction are joined via a joining part JP within the back gate layer BG. By this, a U-shaped memory string MS is formed by the semiconductor layer SC adjacent to each other via the joining part JP.

Specifically, as shown in FIG. 2, semiconductor layers SC11, SC12, SC13 and SC14 are formed sequentially from the front toward the second direction. In detail, semiconductor layers SC11 and SC12 are joined together by a joining part JP11, and a memory string MS0 is formed by this. In addition, a semiconductor layers SC13 and the semiconductor 14 are joined together by a joining part JP12, and the memory string MS1 is formed by this.

In addition, these memory strings MS are provided with memory cells MC, select transistors ST1, ST2 and back gate element BG. Furthermore, the above joining part JP functions as the back gate element BG.

Furthermore, since the structure of other semiconductor layers are the same (for example semiconductor layers SC21, SC22 and semiconductor layers SC23, SC24 that are formed adjacent to semiconductor layers SC11, SC12, SC13 and SC14) along the first direction, the explanation for it has been omitted. In addition, in this, the modification has been shown with m=5 and n=4, but there is no restriction on the number.

As shown, multiple word lines WL are formed along the first direction toward the third direction. The memory cell MC is formed in the supported area of an intersection of this word line WL and semiconductor layer SC.

The top left corner of FIG. 2 shows the magnified sectional structure of the memory cell MC. Surrounding this semiconductor layer SC, a gate oxide film 24c, an insulating layer (charge storage layer) 24b and an insulation layer (block layer) 24a formed from a material that has more permittivity (sometimes referred to as high K) than the gate oxide film 24c are formed along the plane of the first direction and second direction in order from the surface of the semiconductor layer SC. In addition, a conductive layer 20 is formed on the reverse side of this block layer 24a. This conductive layer 20 functions as the control gate of the memory cell MC and is connected to the word line WL.

In addition, a select transistor ST1 is formed in the area corresponding to the intersection of the select signal line SGD and the semiconductor layer SC, and the select transistor ST2 is formed in the area corresponding to the intersection of the select signal line SGS and the semiconductor layer SC.

Furthermore, the explanation of plane P0 will be continued. As the memory strings MS explained above are formed in the U shape, word line WL <7>, WL <6>, WL <5> and WL <4> are sequentially formed on the lower layer considering the select signal line SGD <5> of the drain which is provided on the word line WL that is formed on the uppermost layer as the reference point, WL <3>, WL <2>, WL <1>, WL <0> and a select signal line SDS <5> are formed via the joining part JP11 (back gate element BG) from the lower layer to the upper layer along the semiconductor layer SC11 and the semiconductor layer SC12. Namely, in the U shape, select transistors ST1, multiple memory cell MC, back gate element BG, multiple memory cell MC and select transistors ST2 are formed.

Furthermore, the memory strings MS are arranged with the stacking direction as the longitudinal direction. In addition, it is the same for the semiconductor layers SC13 and SC14.

Furthermore, one end of the semiconductor layer SC12 that passes through the select signal line SGS <5> is connected to the source line SL. One end of the semiconductor layer SC13 adjacent to this source line SL is also connected. In other words, the adjacent semiconductor layers SC11, SC12 and semiconductor layers SC13, SC14 are joined by a common source line SL.

Furthermore, one end of the semiconductor layer SC11 and the semiconductor layer SC14 that pass through the select signal line SGD <5> and SGD <4> are connected by respective bit line BL0. Similarly, one end of the semiconductor layer SC21 and the semiconductor layer SC24 that pass through the select signal line SGD <5> and SGD <4> are connected by respective bit line BL1 and one end of the semiconductor layer SC31 and the semiconductor layer SC34 are also connected in common by each bit line BL2, and one end of semiconductor layer SCml and semiconductor layer SCm4 are also connected by each bit line BLm.

Furthermore, the structure of the memory string MS formed by the semiconductor layer SC13 and SC14 is the same as the structure of the memory string MS formed by the semiconductor layer SC11 and SC12, so its explanation will be omitted.

As shown in the drawing, the word line WL0 and the word line WL7 are formed separately between adjacent semiconductor layer SC such as SC11 and SC12. This is the same between other word lines WL that include the word line WL1 and the word line WL6.

Furthermore, each word line WL (WL<0>-WL<3>) which passes through mutually adjacent semiconductor layer SC12 and semiconductor layer SC13 may be separated as shown in the drawing, or it may be commonly connected.

Here, the example where memory cells MC0-MC7 are formed in each memory string MS has been explained, but there is no limit on the number of the memory cells MC configuring the memory string MS. In other words, the memory cell MC may be 16 or 32. Below, there are cases in which the number of memory cells MC is made as s (s: natural number).

The plane P0 shown in FIG. 2 is configured by arranging the memory cell MC in which data is stored electrically as a 3D matrix. Namely, the memory cell MC, in addition to being arranged as a matrix in the lamination direction, is also arranged as a matrix in the horizontal direction orthogonal to a lamination direction. The multiple memory cells MC arranged in the lamination direction and explained above are connected in series and constitute the memory strings MS.

<Row Decoder 12>

Returning to FIG. 1, the row decoder 12 (includes the block decoder 12-1_0-12-1_i which is explained later, and will simply be called block decoder 12 if it is not differentiated) will be explained. The row decoder 12 decodes the block address signal, etc, which is input from the address command register 17, and the requested word line WL is selected based on this decoding results. The voltage generated by an internal voltage generating circuit 18 is applied through a core driver 19 in the selected word line WL.

<Column Decoder 14>

The column decoder 14 decodes the column address signal, etc. that is input from the address command register 17, and selects the column direction of memory cell array 11.

<Data Circuit Page Buffer>

The data circuit page buffer as shown in the enlarged view is provided with a sense amplifier 13-1 and a data cache 13-2. In addition, the sense amplifier 13-1 is provided with a latch circuit LT.

If the command that does the read operation is input, the data from the selected memory cell MC is read by the sense amplifier 13-1 based on the control by the control circuit 15.

Next, the data read by the sense amplifier 13 is temporarily held in a latch circuit LT and is sent to a data cache 13-2 at a prescribed timing. After this, the control signal (read enable signal) for outputting the data from the host device (controller) is input to the address command register 17 via the input and output circuit 16.

Then, the column address register (address command register 17) is supplied to the column decoder 14 that holds and controls at a prescribed relationship with respect to the clock pulse of the read enable.

The column decoder 14 will become a selected state with respect to the column address register, and the data of the prescribed address is output towards the input and output circuit 16. The data output to the input and output circuit 16 is output to the external host device depending on the read enable signal.

In addition, during a write operation, first, in continuation to the command and address in order to load the write data from the host device, the write data is received via the input and output circuit 16.

The write data is captured in the data cache 13-2. If the command to execute the write operation supplied from the host device is input to the address command register 17, based on the control of control circuit 15, at the prescribed timing, the data that is held in the data cache 13-2 will be sent to the latch circuit LT, and then written to the memory cell MC selected by the voltage control of the word line.

<Control Circuit 15>

The control circuit 15 controls the operation of the nonvolatile semiconductor memory device. Namely, the write operation, read operation and operation sequences based on the control signal, command and address supplied by the address command register 17 are executed.

The control circuit 15, in order to execute this sequence, will control the operation of each circuit block included in the nonvolatile semiconductor memory device. For example, with respect to the internal voltage generating circuit 18, it controls such that the prescribed voltage is generated, or controls the core driver 19 in order to output a prescribed voltage at a prescribed timing to the word line WL and the bit line BL. Furthermore, it is involved in the input output status of the input and output circuit 16.

Also, the control circuit 15, depending on the status of data circuit page buffer 13 (i.e., whether it is in the empty state or read operation state), will output the Ready/Busy B signal (hereafter, it is called the R/BB signal and the Int. R/BB signal.) to the host device.

R/BB signal in the "H" level is called the ready state, and when it is in this state, the nonvolatile semiconductor memory device can receive command, data and address, etc., from the host device.

The R/BB signal in the "L" level is called the busy state, and when it is in this state, the nonvolatile semiconductor memory device cannot receive command, data and address, etc. from the host device.

<Input and Output Circuit 16>

The input and output circuit 16 receives command, address and write data from the external host device (not shown in the drawing), these commands and addresses are supplied to address command register 17 and the write data is supplied to the data circuit page buffer 13.

Moreover, the read data supplied from the data circuit page buffer 13 is output to the host device depending on the control of the control circuit 15.

The input and output circuit 16 is provided with the control signal terminal and the data input output terminal to exchange control signal and data (equivalent to the above command, address and write data).

The control signal includes chip enable, address latch enable, command latch enable, write enable, read enable, write protect, etc. The data input terminal, for example, is provided with I/O (Input/Output)_0-I/0_7.

The data provided to the data input terminal is based on the combination of the state of the above control signal, is recognized as a command, recognized as address and recognized as data. It is acceptable to have a structure with command terminal and address terminal.

<Address Command Register 17>

The address command register 17 temporarily holds the command and address supplied from the input and output circuit 16, and next, supplies the command to the control circuit 15, address to the row decoder 12 and column decoder 14.

<Internal Voltage Generating Circuit 18>

The internal voltage generating circuit 18 generates the prescribed voltage with the write operation, read operation and erase operation based on the control of the control circuit 15. For example, a voltage VPGM, and a voltage VPASS are generated in the write operation, and the voltage VPGM is supplied to the selected word line WL and the voltage VPASS is supplied to the non-selected word line WL.

In addition, voltage VPGM is the voltage that is applied to the selected word line WL in the selected memory string MS. By applying the voltage VPGM to the memory cell MC, the charge storage layer provided in the memory cell MC (which will be described later) is charged and at this threshold the memory cell MC can be shifted to another level.

In addition, the voltage VPASS is the voltage that is applied to the word line WL that is not selected in the selected memory string MS. The data is written to the selected memory cell MC with the application of voltage VPASS to memory cell MC, and controls such that there is no data written to the memory cell MC that has been made as non-writing.

In addition, with the read operation, the internal voltage generating circuit 18 generates a voltage VCGR and a voltage VREAD and supplies the voltage VCGR to the selected word line WL and the voltage VREAD to the non-selected word line WL.

In addition, the voltage VCGR is the voltage that is applied to the selected word line WL in the selected memory string MS. This voltage VCGR is the voltage that depends on the data to be read from the memory cell MC, for example, in case of 2 bit/cell memory cell MC, the voltage is either voltage V_BR, voltage V_AR or voltage V_CR.

In addition, the voltage VREAD is applied to the non-selected word line WL in the selected memory strings MS, and is a pass voltage for reading that can put the memory cell MC to an ON-state without depending on the data held by the memory cell MC. Furthermore, the voltage VREAD is a higher value than the above voltage VCGR. In addition, it is supplied by SG driver 19-1, which will be described later, and the voltage transferred to the select signal line SGD and select signal line SGS is of a smaller value than the voltage VREAD. In addition, the voltage VCGR and the select signal line SGD are related to the voltage transferred to the select signal line SGS, the value changes according to the data to be read; in certain cases, the magnitude relation with voltage VCGR may change.

Furthermore, the internal voltage generating circuit 18 generates voltage VERA with erase operation, and is supplied to the semiconductor layer SC via the bit line and the cell source line. The voltage VERA is, for instance, a voltage of 20 V. Furthermore, to erase the data, a voltage of 20 V, for example, is applied to the semiconductor layer SC, and holes are injected into the control gate by supplying 0 V to the control gate CG of the memory cell MC.

<Core Driver 19>

The core driver 19, the row decoder 12 and the data circuit page buffer 13 are controlled based on the control signal supplied from the control circuit 15 based on the command signal supplied from the address command register 17.

<Circuit Diagram of the Memory Cell Array 11>

Equivalent circuit diagram of the above mentioned plane P will be explained next using FIG. 3. Here, attention is paid to the memory strings MS0-MSi (Positive real number) that is connected to the bit line BL0. Furthermore, as the configuration of each of the memory strings MS0-MSi is the same, the memory string MS0 will be explained below. In addition, the memory strings MS are provided with 16 (s=16) memory cells MC.

<Memory String MS0>

Explanation of the circuit configuration of the memory string MS0 will be given. As shown in FIG. 3, the memory string MS0 is provided with memory cells MC0-MC15, a dummy transistor MCDS, a dummy transistor MCBS, a dummy transistor MCBD, a dummy transistor MCDD, a back gate transistor MC_BG, as well as the select transistor ST1 and select transistor ST2.

Figure 3:
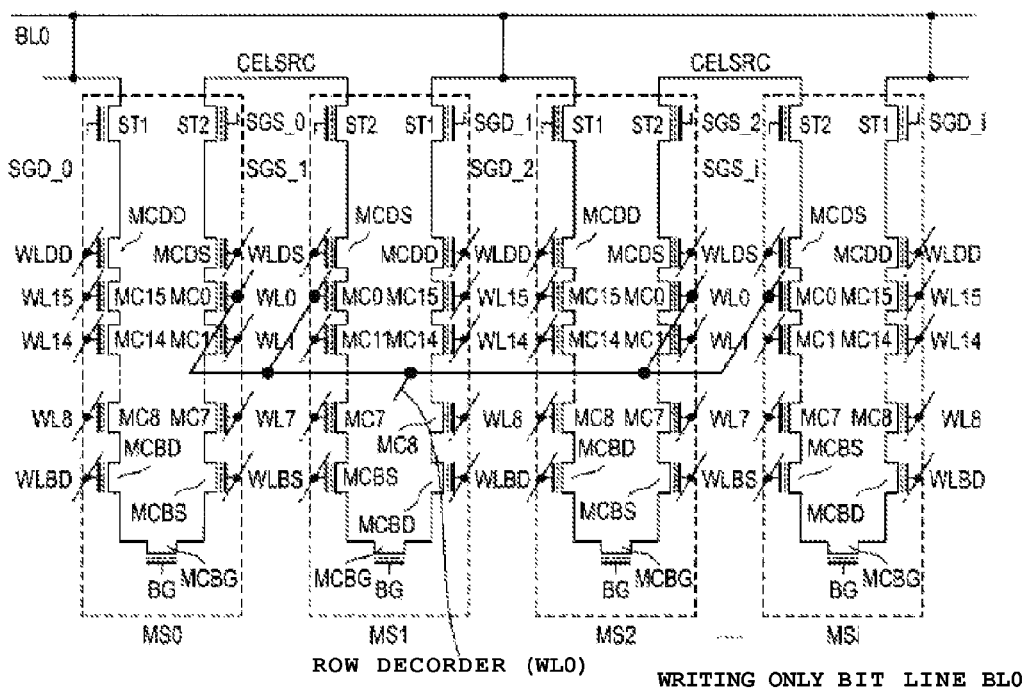
FIG. 3 is an equivalent circuit diagram of the memory cell array of the first embodiment.

FIG. 3 shows the example of the memory string configuration provided with the dummy transistors MCBD and MCBS; however, it may be a configuration that does not include this.

The control gate CG of the memory cells MC0-MC15 functions as the word line WL. Namely, 16 word lines WL are connected with the memory string MS0.

These memory cells MC0-MC7 are connected in series between the dummy transistor MCDS and the dummy transistor MCBS. One end of the current pathway of the dummy transistor MCDS is connected to one end of the current pathway of the select transistor ST2, and the signal WLDS is supplied to the gate of the dummy transistor MCDS.

In addition, the other end of the current pathway of the select transistor ST2 is connected to the source line SL, and a signal SGS_0 (hereafter called select signal line SGS_0) is supplied to the gate of the select transistor ST2.

In addition, one end of the current pathway of the dummy transistor MCBS is connected to one end of the current pathway of the back gate transistor MCBG, and the signal WLBS is supplied to the gate of the dummy transistor MCBS.

The memory cells MC8-MC15 are connected in series between the dummy transistor MCDD and the dummy transistor MCBD. One end of the current pathway of the dummy transistor MCDD is connected to one end of the current pathway of the select transistor ST1, and the signal WLDD is supplied to the gate of the dummy transistor MCDD.

In addition, the other end of the current pathway of the select transistors ST1 is connected to the bit line BL0, and the signal SGD_0 (hereafter called the select signal line SGD_0) is supplied to the gate of the select transistor ST1.

In addition, one end of the current pathway of the dummy transistor MCBD is connected to one end of the current pathway of the back gate transistor MCBG, and the signal WLBD is supplied to the gate of the dummy transistor MCBD. In addition, signal BG is supplied to the gate of the back gate transistor BCBG.

Furthermore, as explained above, since the configuration of the memory string MS1-memory string MSi is the same as MS0, the explanation thereof has been omitted.

The gate of the memory cell MC0-memory cell MC15 which are provided within the memory string MS0-memory string MSi are commonly connected to each other. Namely, for example, the control gate CG (word line WL0) of the memory cell MC0 within the memory string MS0-memory string MSi is commonly connected. It is the same for the control gate CG (word line WL1-word line WL15) of the memory cell MC1-memory cell MC15.

Further, this control gate CG is commonly connected with the entire memory cell MC0 within the memory string MS0-memory string MSi, which are connected to the bit line BL1-BLm not shown in the drawing.

The way in which the word lines WL are commonly connected depends, for example, on the specification of the nonvolatile semiconductor memory device, the size or the wiring of the memory cell MC and the size of the transistor, etc.

For example, the page length corresponding to the alignment direction of the bit line BL (page is the unit of data access) is made as 8 Kbyte, the length of the memory string MS is made as the series of the memory cell 16, the shared range of the memory string MS of the direction along bit line BL is made as 4 strings, and if the data storage capacity of individual memory cell MC is assumed as 2 Bit/cell, then the storage capacity within the memory string MS shared by the word line WL will be 1 Mbyte (=8 Kbyte×16×4×2). This range is referred to as block BLK here.

In addition, if the bit lines are arranged along the direction side by side (page length direction), and the group of multiple memory strings to which the word lines are commonly connected is called as sub-block (Sub-blk). As the memory strings that constitute the Sub-blk are connected to different bit line, respectively, it is not shown in FIG. 3, for example, Sub-blk 0 is an aggregation of MS0 and Sub-blk i will be an aggregation of MSi.

Furthermore, the page is the unit of the word line WL which has a common connection with multiple semiconductor layers SC formed such that it is orthogonal to the bit line BL0-bit line BLm and is formed toward the first direction. Specifically, as an example, the intersection formed by the word line WL0 with the semiconductor layer SC11-semiconductor layer SC51 and the unit formed by the multiple memory cell MC in this intersection region is called the page. In other words, the page refers to a portion or the entire multiple memory cell MS that are selected at the same time by the select word line WL and shared between the groups of multiple memory strings MS. Namely, the page is configured from multiple memory cell MC included in the same Sub-blk from among the memory cell MC that share the word line WL. This nonvolatile semiconductor memory device performs the read operation and the write operation in units of the above page length, and the erase operation is performed in the above block BLK units. In addition, the size of the above block BLK is an example and there is no restriction on this size.

<Threshold Distribution of Memory Cell MC>

Figure 4:
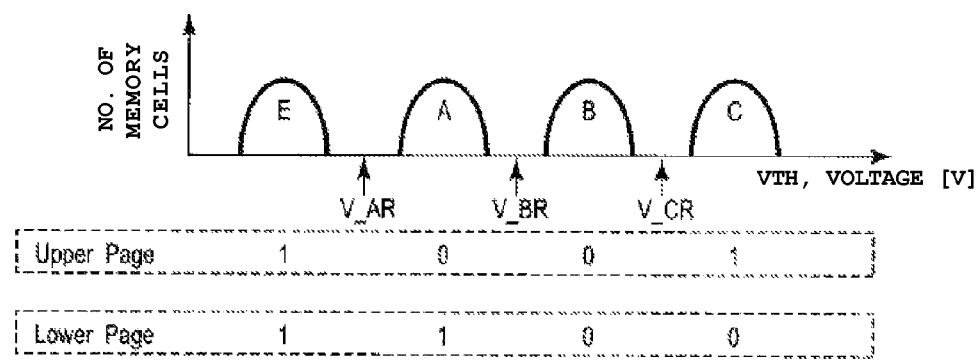
FIG. 4 is a graph showing a threshold distribution of a memory cell of the first embodiment.

Next, the threshold distribution of the memory cell MC using FIG. 4 and the data held in the memory cell MC in accordance with each threshold distribution will be explained. As shown in FIG. 4, the vertical axis represents the number of the memory cells MC and the horizontal axis represents the voltage.

As shown in the drawing, depending on the charging done to the charge storage layer, for example, among the 4 levels of state, (in the order starting with lowest threshold voltage Vth, 4 kinds of data, state E, state A, state B and state C), any one of which can be held. In other words, it is assumed that multi-level memory of 2 bits/cell is possible.

In addition, in this embodiment, it is assumed that the multi-level memory can store data of two pages in one memory cell MC. In other words, focusing on one memory cell MC during read and write operation, when accessing as a lower page, 1 bit data of lower page and when accessing as upper page, 1 bit data of upper page, it is based on the method of data allocation for read and write, instead of read write with respect to the 2-bit data stored in that cell.

First, the lower page will be explained. As shown in FIG. 4, for state E and states A-C when considering the lower page, "1", "1", "0", "0" from the one with low voltage are held.

In addition, for state E and states A-C when considering the upper page, "1", "0", "0", "1" from the one with low voltage are held.

Furthermore, the range of the threshold voltage of state E in the memory cell MC is Vth<V_AR. In addition, the range of the threshold voltage of state A is V_AR<Vth<V_BR. In addition, the range of the threshold voltage of state C is V_BR<Vth<V_CR. In addition, the range of the threshold voltage of state D is V_CR<Vth<VREAD (not shown in the drawing). Furthermore, it is also acceptable if the above memory cell MC is enabled to hold data of more than 8 values.

<Relationship Diagram of Block Decoder 12, Core Driver 19, and Plane P>

Figure 5:
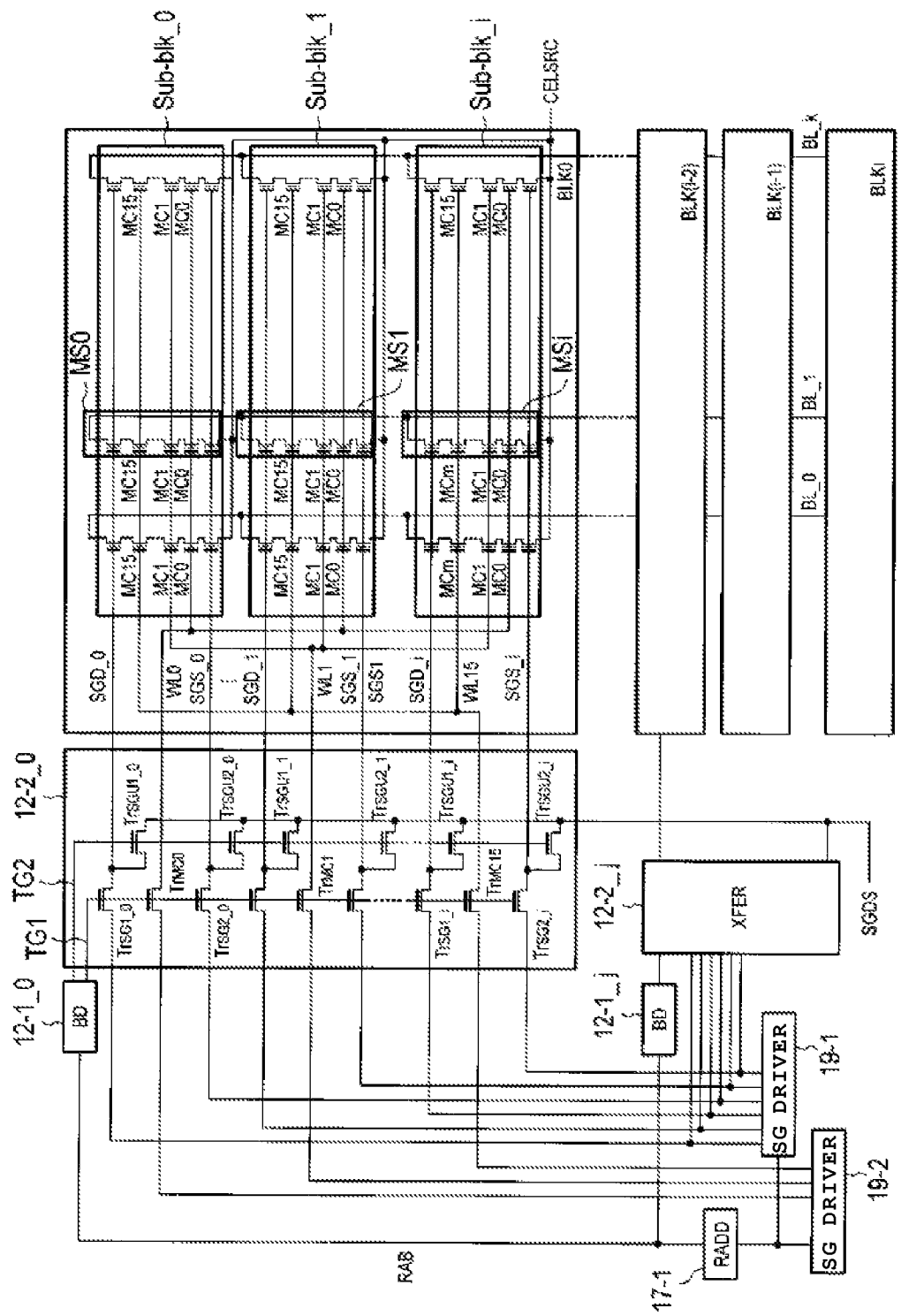
FIG. 5 is a conceptual diagram showing the circuit of a core driver, a row decoder and a memory cell array of the first embodiment.

Next, a block diagram showing a relationship of the block decoder 12, the core driver 19 and the plane P is shown using FIG. 5. Here, explanation will be continued omitting the dummy transistors MC_DS, MC_BS2, MC_BS1, MC_DD and MC_BG that constitute the memory string MSi.

<Block Decoder 12-1_0-12-1_i>

Each of the block decoders 12-1_0-12-1_i are provided such that it supports the word line WL that supports the block BLK of the memory cell array 11 and the transfer gate groups 12-2_0-12-2_i which are connected to the select signal line. As the configuration is the same, here the block decoder 12-1_0 and the transfer gate group 12-2_0 are explained.

<Block Decoder 12-1_0>

The block decoder 12-1_0 is a circuit that outputs a block selection signal after decoding the block address signal supplied from a row address register RADD 17-1 that is included in the address command register 17.

In FIG. 5, a unit of the memory array 11 including the memory string MS0-memory string MSi is considered as a block BLK; in this block BLK, for example, if attention is paid to the word line WL0, MC0 of all memory strings MS is commonly connected.

The block decoder 12-1_0 changes the signal TG1 to "H" level, when the input block address matches with the unique address of the decoder. Furthermore, in this case, signal TG2 is at level "L".

In contrast to this, if the block address does not match with the unique address of the decoder, signal TG2 is changed to "H" level. Furthermore, in this case, signal TG1 is at level "L".

Namely, signal TG1 is the control signal for selecting the block BLK and signal TG2 is the control signal for un-selecting the block.

Here, signal TG1 is the signal for selecting the block BLK and signal TG2 is the signal for un-selecting the block BLK. In addition, the amplitude of signal TG1 and signal TG2 is different. This is because the amplitude of the signal TG1 will have a voltage level higher than the write voltage VPGM during write because of the level shifter circuit contained within the block decoder BD12-1_0, and will have a voltage level that is higher than the read pass voltage VREAD during read, moreover, on the other hand, the amplitude of signal TG2 is close to the voltage level of the power supply voltage of the logic circuit (For example, voltage VDD: 1.8 V etc.,). These signals TG1 and TG2 are output to the transfer gate group 12-1_0 that support the block.

<Transfer Gate Group>

The block decoder 12-2_0 is a set of transfer gates and includes transistor $Tr_{SG1\_0}$-transistor $Tr_{SG1\_i}$, transistor $Tr_{SG2\_0}$-transistor $Tr_{SG2\_i}$, transistor $Tr_{MC0}$-transistor $Tr_{MC15}$, transistor $Tr_{SGU1\_0}$-transistor $Tr_{SGU1\_i}$ and transistor $Tr_{SGU2\_0}$-transistor $Tr_{SGU2\_i}$.

Namely, transistor $Tr_{SG1\_0}$-transistor $Tr_{SG1\_i}$, transistor $Tr_{SG2\_0}$-transistor $Tr_{SG2\_i}$, transistor $Tr_{SGU1\_0}$-transistor $Tr_{SGU1\_i}$ and transistor $Tr_{SGU2\_0}$-transistor $Tr_{SGU2\_i}$ are provided only with the number of memory strings MS.

In addition, transistor $Tr_{MC0}$-transistor $Tr_{MC15}$ are provided with only the number of memory cells MC which are arranged within each memory string MS0-memory string MSi. Here, the number of memory cell MC is made as 16 (s=16).

The specific structure will be explained below.

One end of the current pathway of transistor $Tr_{SG1\_0}$ is connected to the SG driver 19-1, and the other end is connected to the gate of the select transistor ST1 provided within the memory string MS0 via the select signal line SGD_0 and the signal TG1 from the block decoder 12-1_0 is supplied to the gate. This transistor $Tr_{SG1\_0}$ transfers, as necessary, the prescribed voltage level ("H" level, for example Voltage VDD: 1.8 V) transferred from the SG driver 19-1 to the gate of selected transistor ST1.

One end of the current pathway of transistor $Tr_{SG2\_0}$ is connected to the SG driver 19-1, and the other end is connected to the gate of the select transistor ST2 that is provided within the memory string MS0 via the select signal line SGS_0 and the signal TG1 from the block decoder BD_0 is supplied to the gate. This transistor $Tr_{SG2\_0}$ transfers, as necessary, the prescribed voltage level ("H" level) transferred from the SG driver 19-3 to the gate of the selected transistor ST2.

Furthermore, one end of the current pathway of transistor $Tr_{MC0}$ is connected to the CG driver 19-2, and the other end is connected to the word line WL0 that is provided within the memory string MS0-memory strings MSi, and the signal TG1 from the block decoder BD_0 is supplied to the gate.

This transistor $Tr_{MC0}$ transfers, as necessary, the prescribed voltage level ("H" level) transferred from the CG driver 19-2 to the gate of the individual memory cell MC0.

Furthermore, one end of the current pathway of transistor $Tr_{SGU1\_0}$ is connected to the select signal line SGD_0, signal SGDS is supplied to the other end, and signal TG2 is supplied from the block decoder 12-1_0 to the gate.

In addition, one end of the current pathway of transistor $Tr_{SGU2\_0}$ is connected to the select signal line SGS_0, signal SGDS is supplied to the other end, and signal TG2 is supplied from the block decoder 12-1_0 to the gate. These transistors $Tr_{SGS1\_0}$ and $Tr_{SGS2\_0}$ in case of the non-selection of the memory string MS0, select transistors ST1 and ST2 are put in the off state, namely, signal SGDS ("L" level) is sent to the gate of the select transistors ST1 and ST2.

In other words, if the memory string MS0 is selected, transistor $Tr_{SG1\_0}$ and transistor $Tr_{SG2\_0}$ will transfer the voltage level ("H" level) supplied by the SG driver 19-1 to the select transistors ST1 and ST2 of the memory string MS0.

On the other hand if the memory string MS0 is not selected then there are two ways. If the memory string MS0 is not to be selected with the block decoder 12-1_0 in the selected state, then the voltage "L" level is supplied via the transistor $Tr_{SG1\_0}$ and transistor $Tr_{SG2\_0}$ to the select transistors ST1 and ST2. In addition, in case the block decoder 12-1_0 goes to the non-selective state then not only the memory string MS0 but also all the memory strings controlled by the block decoder 12-1_0 will go to the non-selective state, and the Signal SGDS ("L" level) will be supplied to the gate of the select transistors ST1 and ST2 via the transistors $Tr_{SGU1\_0}$-$Tr_{SGU1\_j}$ $Tr_{SGU2\_0}$-$Tr_{SGU2\_j}$ and the memory strings will go into the non-selective state.

The configuration of the transistor $Tr_{SG1\_1}$, transistor $Tr_{SG2\_1}$, transistor $Tr_{MC1}$, transistor $Tr_{SGS1\_1}$ and transistor $Tr_{SGs2\_1}$ which supports the memory string MS1 is the same as that of transistor $Tr_{SG1\_0}$, transistor $Tr_{SG2\_0}$ transistor $Tr_{MC0}$, transistor $Tr_{SGS1\_0}$ and transistor $Tr_{SGS2\_0}$ which supports the memory string MS0.

In other words, one end of the current pathway of transistor $Tr_{MC1}$ is connected to the CG driver 19-2, and the other end is connected to the word line WL1 which is provided within the memory string MS0-memory string MSi, respectively, and the signal TG1 from the block decoder 12-1_0 is supplied to the gate. This transistor $Tr_{MC1}$ transfers, as necessary, the prescribed voltage level ("H" level) transferred from the CG driver 19-2 to the gate of the individual memory cell MC1.

In addition, transistor $Tr_{SG1\_1}$, transistor $Tr_{SG2\_1}$, supplies a voltage at "H" level to the select transistors ST1 and ST2 when the memory string MS1 is selected and it reads out data from the prescribed memory cell MC.

On the other hand, to make the memory string MS1 non-selective, as explained above, the case in which the select transistors ST1 and ST2 are changed to the OFF state by the voltage supplied via transistor $Tr_{SG1\_1}$, transistor $Tr_{SG2\_1}$, and the case in which all the memory strings included within the block will become non-selective based on the non-selective state of the block decoder.

Similarly, it is the same for transistor $Tr_{SG1\_j}$ and transistor $Tr_{SG2\_j}$ which supports memory strings MS2-MSi.

<SG Driver 19-1>

Next, SG driver 19-1 will be explained. For example, with the read operation, SG driver 19-1 receives the page address signal RAP supplied by the row address register RADD 17-1 and based on this signal RAP, supplies "H" level to transistor $Tr_{SG1}$, and transistor $Tr_{SG2}$ which support select memory string MS, and, supplies "L" level to transistor $Tr_{SG1}$, and transistor $Tr_{SG2}$ which support the non-selective memory string MS.

<CG Driver 19-2>

Next, CG driver 19-3 will be explained. For example with the read operation, CG driver 19-2 receives the page address signal RAP supplied by the row address register RADD 17-1 and based on this signal RAP, transfers the voltage VCGR to the transistor $Tr_{MC}$ that supports the select word line within the transistor $Tr_{MC1}$-transistor $Tr_{MC15}$.

In addition, CG driver 19-4 transfers the voltage VREAD to the transistor $Tr_{MC}$ that supports the non-selected word line WL.

<Row Address Register 17-1>

Next, the row address register 17-1 (in the drawing, RADD) will be explained. The row address register 17-1 supplies the address supplied by the address command register 17 to the block decoders 12-1_0-12-1_j, the SG driver 19-1 and the CG driver 19-2.

Here, the page address signal that is input to the core driver 19 (SG driver 19-1 and CG driver 19-2) from the row address register 17-1 will be explained in detail.

Figure 6:
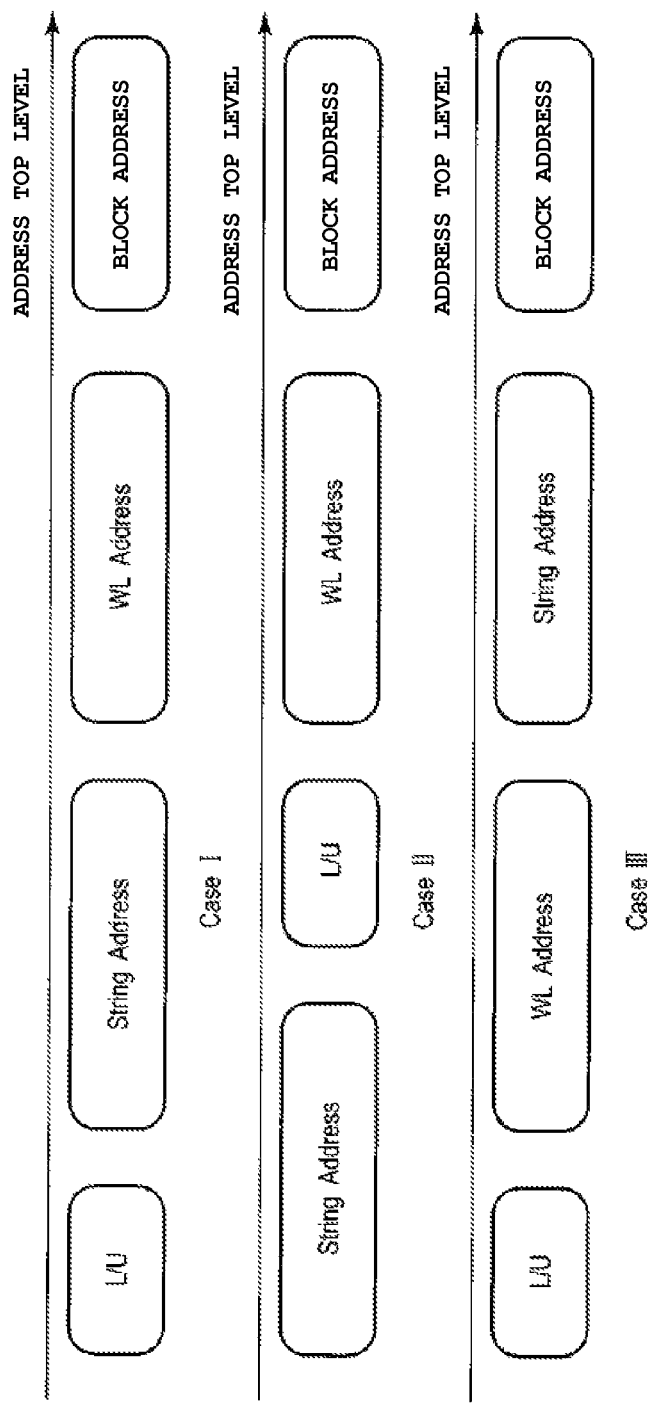
FIG. 6 is a conceptual diagram of a page address map of the first embodiment.

The details of the page address signal and its relation with the block address signal are shown in FIG. 6. As mentioned above, the page is the basic unit for accessing data in the nonvolatile semiconductor memory device, and there are multiple pages included in the above mentioned block BLK.

The page defined in NAND gate flash can be selected by either specifying (identifying) the word line WL within the memory string MS or either the upper page or lower page in the case of multi-level memory cell.

However, the page of this embodiment is shared between the groups of multiple memory strings MS mentioned above. For this reason, the information as to which group (Sub blk) of the memory string MS it belongs to is required.

So, for example, as shown in FIG. 6, three cases (CASE I-CASE III) of page address map can be considered. Based on the above, as the page is within the block BLK, the page address in any of the cases will be an address that is mapped lower than the block address.

In all the embodiments explained below, sharing between the groups of the above memory string MS is assumed, and it intends to achieve speeding up of continuous read operation. Specifically, it pays attention to the operation (read cache operation) for continuously reading the data by specifying the command that adds the page address one page at a time with the command input.

Case I

The mapping shown in CASE I is an allocation from the least significant bit to the most significant bit of the page address sequentially, the address of the lower page/upper page (L/U in the drawing), the address showing the group of the memory string MS within the block BLK (shown as string address in the drawing), the word line address of the memory string MS (shown as WL address in the drawing) and the block address.

Specifically, increment is carried out to the address of the memory string MS while changing the address from the upper page to the lower page (or from the lower page to the upper page) of the memory cell MC. At this time, in 1 block BLK, word line address will be fixed until it reaches the final memory string MS (for example, memory string MSi).

Namely, once the reading is completed for both the upper page and the lower page of the memory cell MC0 provided in the last memory string MSi, the target of reading based on the address supplied by RADD 19-5, for example, switches from the memory cell MC0=> the memory cell MC1, and is again incremented according to L/U and string address. In this way, the mapping of CASE 1 performing the read operation is performed by giving more priority to the switching of the upper page/lower page than the switching of the memory string MS and giving more priority to switching of the memory string MS than the switching of the word line WL.

In other words, the mapping is such that it is difficult to change the word line WL while the page address is being incremented.

Figure 7:
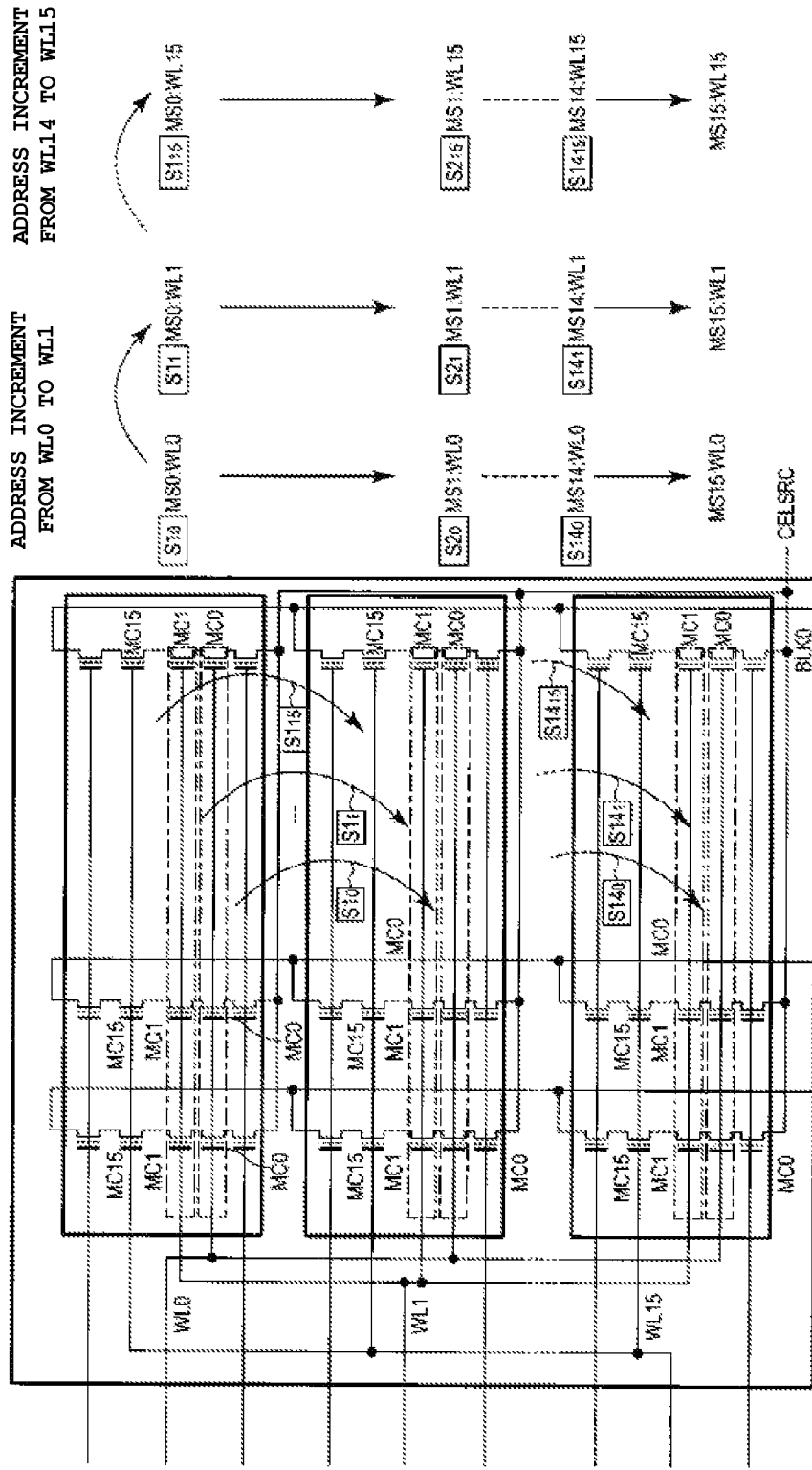
FIGS. 7A to 7D are conceptual diagrams showing a read operation of the first embodiment.

FIG. 7A to FIG. 7D show the state of transition of the page selection. FIG. 7A is part of the plane P explained in the above FIG. 5, and is the circuit diagram showing the memory string MS0-MSi which configures a particular single block BLK.

As described above, if the initial page address is incremented from the state of selecting the lower page of the memory cell MC0 of the memory string MS0, the selection of the memory string MS will be switched with the word line WL0 remaining fixed as shown in FIG. 7B.

In addition, the lower page/upper page will be switched with each increment of the page address.

Next, if the number of MSi is made i=15, after the selection of MS15, the word line address will be incremented at the same time of the switching to the selection of memory string MS0. That is, the word line WL selection changes from WL0 to WL1.

After this, if the page address continues to be incremented, as shown in FIG. 7C with the word line WL1 selected, the selection of the memory string MS is switched while the lower page/upper page is switched.

In the same way, if the page address continues to be incremented, finally, it becomes possible to select all the pages of the block BLK if the selection of the memory string MS is switched while the lower page/upper page is switched with the word line WL15 remaining fixed as shown in FIG. 7C.

Case II

The mapping shown in CASE II is an allocation from the least significant bit to the most significant bit of the page address sequentially, address that shows the group of the memory string MS within the block BLK (shown as string address in the drawing), the address of the lower page/upper page (L/U in the drawing), the word line address of the memory string MS (shown as WL address in the drawing) and the block address.

Specifically, if, for example, the address of the memory cell MC is fixed to the lower page, and the address of the memory string MS is incremented, and the string address reaches the final address (here, the memory string MS15), next the address of the memory cell MC is fixed to the upper page, and again the address is incremented from the memory string MS0 again. This operation is repeated until the memory strings MS0-MS15.

Namely, in this mapping, while the memory cell MC0 is selected, switching of the memory string MS is given priority over switching of the upper page/lower page. Therefore, in this method, too, it is difficult to change the selected word line WL. The difference is that whether changing the multi-level storage bit is first or changing the memory string MS is first.

Case III

The mapping shown in CASE III is an allocation from the least significant bit to the most significant bit of the page address sequentially, the address of the lower page/upper page (L/U in the drawing), the word line address of the memory string MS (shown as WL address in the drawing), the address that shows the group of the memory string MS within the block BLK (shown as string address in the drawing), and the block address.

Specifically, the word line WL address is incremented while switching the address of the memory cell MC between the lower page and the upper page for the address. Next, once the word line address reaches the final address (here, the memory line WL15), the address of memory string MS is incremented next.

Namely, in this mapping, when the memory cell string MS0 is selected, while switching of the upper page/lower page each time, the memory cell MC within the memory string MS, namely word line switching is given priority.

<Timing Chart that Indicates Read Operation>

Next, the above mentioned read operation will be explained using the timing chart of FIG. 8A and FIG. 8B.

Figure 8:
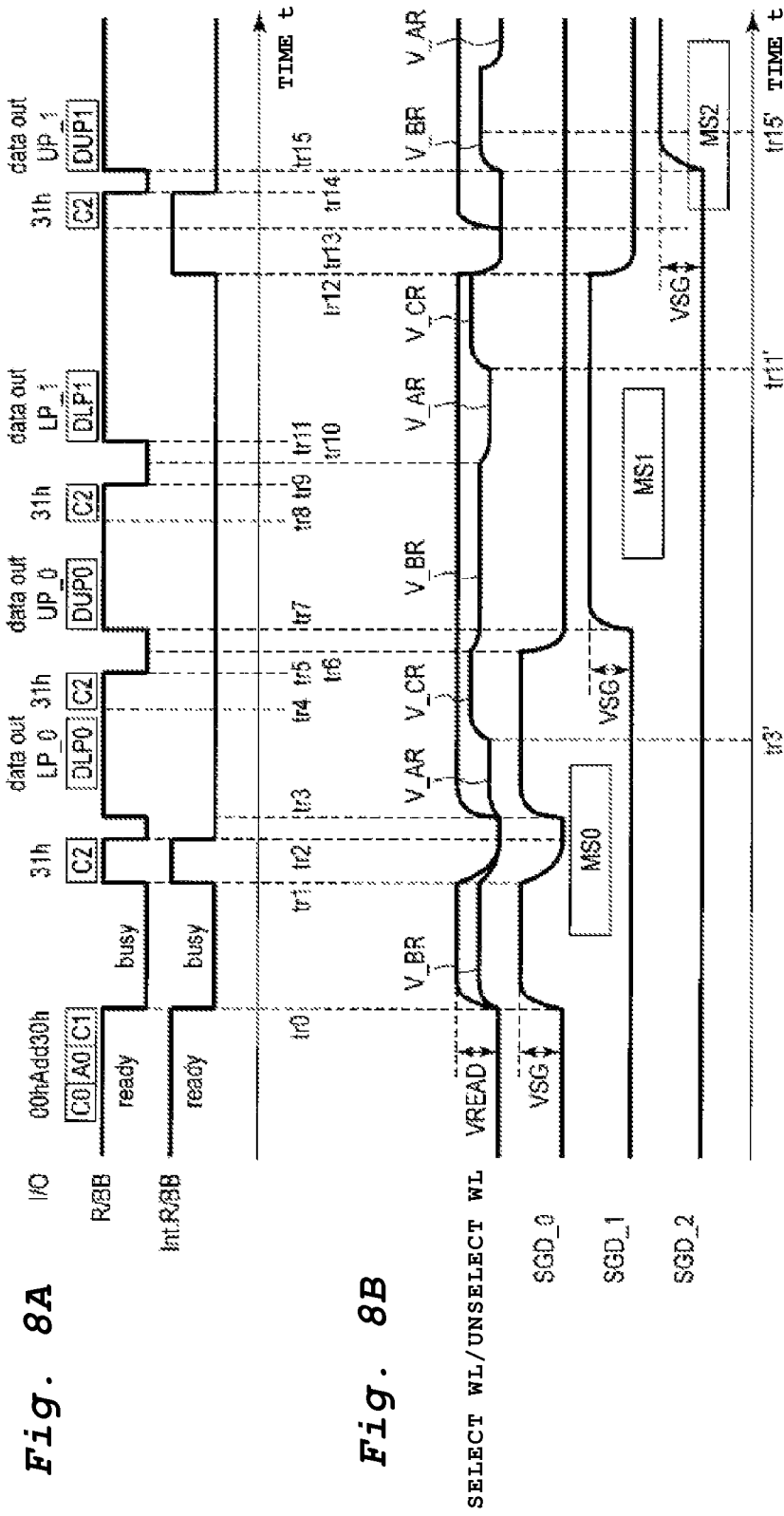
FIGS. 8A and 8B are the timing charts of a read operation of the first embodiment.

The timing chart shown in FIG. 8A is the command and address supplied by the host device as well as the ready/busy B (R/BB) signal output by the nonvolatile semiconductor memory device, and shows the operation to transfer the read data to the data cache (hereafter called read data cache operation). As shown in FIG. 8A, time tr is obtained along the horizontal axis, the command and address supplied by the host device, ready/busy B signal showing the status of the nonvolatile semiconductor memory device to the outside, and ready/busy B signal showing the internal state of the nonvolatile semiconductor memory device are obtained via I/O along the vertical axis.

In addition, FIG. 8B is the timing chart of the word line WL that operates based on the command and address supplied by the host device and the voltage change of selection signal, with time along the horizontal axis t, the voltage level of the selective/non-selective word line WL and the voltage level of the signal line (SGD_0, SGD_1 and SGD_2) are taken on the vertical axis.

Furthermore, in the read operation below, the read operation will be explained, paying attention to the memory cell MC0 within the memory string MS0-memory string MS2 connected to the bit line BL0, and it will be the same for the read operation of the memory string MS3-memory string MSi First, commands C0 ("00h"), C1 ("30h") and C2 ("31h") supplied from the host device will be explained.

"00h": indicates the address of memory cell MS that performs the read operation.

"30h": indicates the execution of read operation. The word line WL corresponding to the page of the address specified with 00h is selected and the data is read to data circuit page buffer 13. In detail, the data is read to the data cache 13-2 via the sense amplifier 13-1.

Furthermore, after the data that has been read is stored in the data cache 13-2 and Ready/Busy B signal becomes "H", the data read will be output from the input and output circuit 16 depending on the clock pulse of the read enable signal.

"31h": the data read to the sense amplifier 13 will be transferred to the data cache 13-2 at the prescribed timing, and the page address will be incremented and the next read operation will be started. It will be possible to output the data that has been stored in the data cache 13-2 in the same way as 30h to the outside by making R/BB signal as "H".

In addition, the following notation will be explained.

"Add": Address that depends on the page address map shown in Case 1. The address is made as the memory strings MS0 and the memory cell MC0.

"D_LP0": The lower page data of the memory cell MC within the memory string MS0.

"D_UP0": The upper page data of the memory cell MC within the memory string MS0.

<Memory String MS0>
<Lower Page Reading>

First before time t0, the control circuit 15 makes R/BB signal as ready state ("H" level) with respect to the host device. For this reason, the command and address (C0, A0, C1) are supplied from the host device via the input and output circuit 16.

Then, the control circuit 15 makes both R/BB signal and Int. R/BB signal as busy state ("L" level) at time tr0.

If it is in a busy state, it will be in a state in which it cannot receive any external commands except for the reset command, and the read operation will be executed. Specifically, voltage V_BR will be supplied to the select word line WL0 by the internal voltage generating circuit 18, voltage VREAD will be supplied to the non-selected word line WL1-WL15 and voltage VSG will be further supplied to the select signal line SGD_0 corresponding to the memory string MS0 between time tr0 to tr1. In addition, at the same time or the prescribed time, voltage VSG will be applied to the select signal line SGS_0 (not shown in the drawing).

With this, the lower page data held by the memory cell MC0 will be read and it will be transferred to the cache 13-2 after being held temporarily in the latch circuit LT within the sense amplifier 13-1.

Specifically, for example, the data of the memory cell MC0 of the memory string MS0 and the memory cell MC of 8 kbyte that shares the word line will be read at this time.

R/BB and Int. R/BB are changed to a ready state ("H" level) once again at time tr1 when the read out of the lower page data is completed, and the potential of the word line WL0 is returned to its initial value.

Namely, it will be changed to the state where it will be possible to receive the command and data address from the host device. After this, it is possible to output the data held in the cache 13-2 by the control of the read enable signal (RE) to the host device, but if the operation to increase the throughput of read is done, the data cannot be output.

Alternatively, if the command ("C2") from the host device is supplied, the nonvolatile semiconductor memory device will once again change the state of R/BB and Int. R/BB to a busy state ("L" level), and will transfer the read data stored in the latch circuit LT during time tr2-tr3 to the data cache 13-2 again.

This data cache 13-2 as mentioned above is provided in the data circuit page buffer 13, and is a storage part that can temporarily store the read data. After this, the page address is incremented and read operation of the next page is started automatically. Namely, the read operation of the upper page starts from timing tr3.

Furthermore, as the lower page is read by the normal read execution command between tr0 to tr1 that does not mean the cache operation of command C1 (actually, 30 h for example), the read operation is completed by electric discharge of the voltage applied to the word line WL after time tr1.

Next, R/BB signal will be put to a ready state ("H" level) at time tr3. For this reason, input and output of data between the nonvolatile semiconductor memory device (mainly, the input and output circuit 16) and the host device will be possible. Namely, after tr3, based on the read enable signal (RE) output from the control circuit 15, for example, the read data (D_LP0) of 8 kbyte is output (toggle output) 8 bits at a time from the input and output circuit 16.

<Upper Page Read>

Since the instruction (command C2) is received at the above mentioned time tr1 to read data of the upper page, the read operation is resumed after time tr3. The upper page reading of the memory cell MC0 of the memory string MS0 will be explained below.

After time tr3, internally (inside the plane) in the nonvolatile semiconductor memory device, in order to read the data of the upper page, voltage V_AR is output to the select word line WL0 until time tr3', and voltage V_CR is output to the select word line WL0 from tr3'-tr6. In addition, read operation of MS0 is started by applying voltage VSG again to the select signal line SGD_0 and SGS_1 of the memory string MS0.

The data (for example, 8 kbyte) of the upper page will be read by this read operation. Namely, if the memory cell MC0 is in the ON state with voltage V_AR, and voltage memory cell MC0 is in the OFF state with V_CR, it is determined as "1" data, otherwise (memory cell MC0 is in the OFF state with voltage V_AR, and voltage memory cell MC0 is in the ON state with V_CR) it is determined as "0" data.

Furthermore, a command ("C2": 31h) is supplied from the host device at time tr4. This command is a command that executes the reading of the data of the memory cell MC0 within the next memory string MS1.

If the command with the instruction for the next operation is supplied from the host device during the time this read operation is being performed, the control circuit 15, while maintaining the potential of the non-selected word line WL at a fixed potential, will migrate the read operation to the adjacent memory string MS1.

In addition, the upper page data that is read at time tr6-tr7 is transferred to the data circuit page buffer 13 (data cache 13-2). After that, R/BB signal will again be put to a ready state ("H" level) after time tr7. For this reason, after time tr7, based on the read enable, the read data that is stored once in the data cache 13-2 is output to the host device via the input and output circuit 16.

If the data read at the memory string MS0 is completed, the read operation of the page (For example, 8 kbytes) corresponding to the memory cell MC0 within memory string MS1 is started.

In addition, since the memory string MS0 is the target for read during the above time tr0-tr 6, the select signal line SGD_1 and the select signal line SGD_2 corresponding to the memory string MS1 and the memory string MS2 are considered to be at level "L", respectively.

<Memory Storing MS1>

Next, the read operation in the memory string MS1 will be continued to be explained using the timing chart.

<Lower Page>

At time tr7, the voltage transferred to the select word line WL0 by the internal voltage generating circuit 18 is switched from voltage V_CR to voltage V_BR. In addition, after time tr3, the voltage of the non-selected word line WL is maintained at voltage VREAD.

Here, the word line WL remains as WL0 without change though the page that is the target of reading based on the read cache operation command input at time tr4, changes from the page corresponding to the memory cell MC0 of the memory string MS0 to the page corresponding to the memory cell MC0 of the memory string MS1.

Therefore, large potential change of the word line WL and charging and discharging of the electric charge is not required due to switching of the select word line WL and the non-selected word line WL. At this timing, it is acceptable to reduce the potential of the select word line WL from V_CR to V_BR while the voltage VREAD is applied to the non-selected word line WL.

However, at the timing of time tr7, the internal voltage generating circuit 18 supplies voltage VSG to the select signal line SGD_1 of the memory string MS1 via the core driver 19, and in addition, at the same time or at a prescribed timing, voltage VSG is applied to the select signal line SGS_1 (not shown in the drawing) and based on this, the select memory string MS is changed.

If the page address that changes due to command C2 is incremented, in this embodiment, the first upper page and the lower page changes, and next, the memory string MS changes. With this, the memory string MS1 will be selected.

With respect to the signal line, the time required to switch this potential is considerably shorter than the delay time required for the stabilization of the word line WL since a smaller RC delay is required when compared to the word line WL. Furthermore, since the voltage that is output by the internal voltage generating circuit 18 is the same as the case of the above memory string MS0, the explanation will be omitted.

At time tr8, if the command ("C2":31h) is supplied by the host device, R/BB signal will go to the busy state namely "L" level once again. In addition, at time tr10, if the reading of the lower page data is completed, at time tr10-tr11, the read data is transferred to the data circuit page buffer 13 (data cache 13-2).

Thereafter, after time tr11, the read data that is stored in the data cache 13-2 is output to the host device in response to the read enable signal via the input and output circuit 16.
<Upper Page>

Next, the read operation of the upper page of the memory cell MC0 provided within the memory string MS1 will be explained.

In the same way as explained above, from time tr10, reading of the upper page data is started and at time tr12, the read operation will be completed. The control circuit 15 stops the read operation if there is no command from the host device to read the data held in the memory cell MC0 of the next memory string MS2 during the time tr10-tr12. Namely, the voltage supplied to the non-selected, the select word line WL and the signal line is shifted to 0V. In this way if the read operation within the nonvolatile semiconductor memory device (plane P) is completed, Int. R/BB is changed to a ready state, namely, "H" level by the control circuit 15.

If the command is supplied at time tr13, R/BB signal will go to the busy state at time tr14, at this timing, the read upper page data is transferred from the latch circuit LT of the data circuit page buffer 13 to the data cache 13-2 at time tr12.

Thereafter, once again at time tr15, the next page read operation is performed by applying voltage VREAD to the non-selected WL, voltage V_BR to the select word line WL and voltage VSG to the signal line by the internal voltage generating circuit 18 via the core driver.

Results of First Embodiment

The nonvolatile semiconductor memory device of this embodiment can achieve the effectiveness of (1) and (2) mentioned below.
(1) The Speed of the Read Operation can be Improved.

Namely, if it is the nonvolatile semiconductor memory device of this embodiment, by reducing the operation that charges and discharges the word line WL, it is possible to shorten the time until the start of sensing operation. Specifically, if continuous page read operations are to be performed with the read cache operation, the operation state with a fixed select word line WL will continue, even if the selected page that is the target of reading is switched.

For this reason, the delay time for potential control of the word line WL will be limited to the shifting time to the multiple reading potential for a multi-level storage operation, and the time required to stabilize the potential of the word line WL can be shortened.
(2) It is Possible to Reduce Power Consumption.

If it is the nonvolatile semiconductor memory device of this embodiment, with the condition of the effectiveness (1) mentioned above, the read operation can be performed without the electrode potential of the word line WL having to return to the initial state. Namely, the selected state of the word line WL reads the upper page and reads the lower page, and since it does not change when it is being switched such that it reads a different upper page from the one mentioned above, for the select word line WL, it may shift in the range of applied voltage to the select word line WL such as V_AR, V_CR, V_BR, V_AR, V_CR . . . and so on. In addition, the applied state of voltage VREAD across multiple pages reads can be maintained with respect to the non-selected word line WL. For this reason, the amount of charge that is charged and discharged in a word line WL can be reduced and it will be possible to reduce power consumption of the internal voltage generating circuit 18.

Second Embodiment

Next the nonvolatile semiconductor memory device of the second embodiment will be explained. The nonvolatile semiconductor memory device of this embodiment differs from the first embodiment above in that command C3 (3×h) instead of command C1 and C2 is used. Command C3 will be explained first.

Command C3 is a command that requires the data cache 13-2 read operation. Namely, it is a command that can improve the efficiency of the read operation by further shortening the read time when compared to the first embodiment above, and in addition, by reducing the amount of charge that is charged and discharged in a word line WL from that of the above mentioned the first embodiment.

Specifically, it is a command, for example, which reads the lower page data for example from memory cell MC0 within memory string MS0, next transfers the lower page data that has been read to the data circuit page buffer 13 (data cache 13-2), and then automatically executes the read operation for the data of the next page (upper page) even if the new command (if it is the first embodiment mentioned above, command C2 will be supplied) has not been input.

Furthermore, command C3 that is supplied by the host device at timing's time tr3, time tr7 and time tr12 is a command supplied by the host device once the data of the read page (for example 8 kB) just read before is transferred to the host device.

Namely, once the control circuit 15 receives this command C3, all the previous read data held in the data cache 13-2, or all the required data for the host device will be sent to the host device, and it is recognized that the data cache 13-2 will be in a state where the next read data can be overwritten. In addition, the control circuit 15 recognizes the command C3 that is supplied at time tr3, time tr7 and time tr12 as the command that transfers the read operation to the data held by next page of the same memory cell MC (if the previous page is the upper page then the lower page and if the previous page is the lower page then the upper page), or to the data held by the memory cell MC within the next memory string MS.

In other words, during the time when R/BB signal is in the "H" level (ready state), it is a command that shifts the read operation to the next page of the same memory cell MC or the memory cell MC of the next memory string MS once it recognizes that all the read data that is transferred from the latch circuit LT of the sense amplifier 13-1 to the data cache 13-2 has been transferred to the host device.

<Read Operation>

Figure 9:
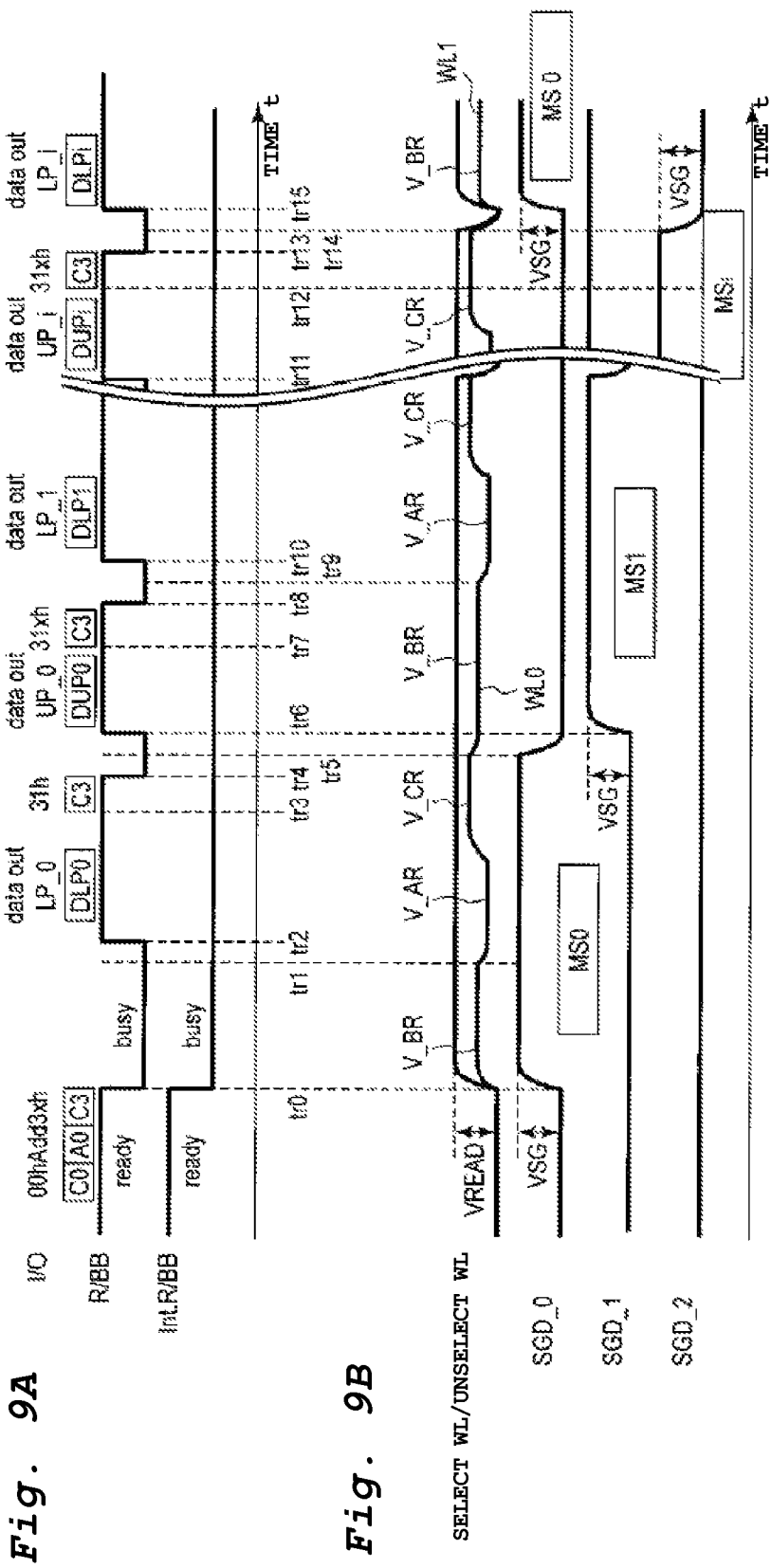
FIGS. 9A and 9B are timing charts of a read operation of a second embodiment.

The read operation of the nonvolatile semiconductor memory device of the second embodiment will be explained using FIG. 9A and FIG. 9B. FIG. 9A and FIG. 9B are the timing charts showing the read operation.

As shown in FIG. 9A, time tr is obtained along the horizontal axis, and the command and address supplied by the host device, ready/busy B signal showing the status of the nonvolatile semiconductor memory device to the outside and ready/busy B signal showing the internal state of nonvolatile semiconductor memory device are obtained with I/O along the vertical axis.

In addition, FIG. 9B is the timing chart of the word line WL that operates based on the command and address supplied by the host device and the voltage change of the select signal, with time along the horizontal axis t, voltage level of the select/non-select word line WL and voltage level of the signal line (SGD_0, SGD_1 and SGD_2) are taken on the vertical axis.

The read operation of the second embodiment will be explained below using a timing chart while omitting the explanation of the points that are same as the read operation of the above mentioned the first embodiment. Further, for the read operation of this embodiment also, the page address map possessed by this nonvolatile semiconductor memory device will be considered as Case 1.

Just before tr0, command C0 (00h), add, command C3 (3×h) are supplied from the host device. As mentioned above, since command C3 is supplied from the host device, the control circuit 15 after it output's Voltage V_BR to the internal voltage generating circuit 18 will control such that there is a shift from voltage V_BR to voltage V_AR without returning to the initial state.

In addition, the control circuit 15 will read out the lower page data read at time tr1 to the latch circuit LT by time tr1 and then transfer the data captured in the latch circuit LT between time tr1-tr2 to the data cache 13-2.

Thereafter, it will read the data of the upper page until time tr5, and then execute the above mentioned data cache 13-2 read operation.

Next, the address of the memory string MS will be incremented by 1, and the data read out from the memory cell MC0 within the memory string MS1 will be executed from time tr6. The above operation is repeated until the memory cell MC0 within the memory string MSi.

Thereafter, when time tr14 is reached, the read operation until the memory cell MC0 of the memory string MSi is completed. For this reason, the control circuit 15 increments the address of the memory cell MC by +1 from the memory cell MC0 to the memory cell MC1 while returning the memory string MSi to the memory string MS0 by incrementing the address of the memory string MS by +1. Namely, the target of reading is switched from the memory cell MC0 to the memory cell MC1.

For this reason, at time tr15, the internal voltage generating circuit 18 will once change the voltage VREAD to 0V that is being supplied to the word line WL1 until that time, and then supply voltage V_BR.

For the word line WL0, it will once change the voltage V_CR to 0V that is being supplied to the word line WL0 until that time, and then supply voltage VREAD.

Thereafter, the word line WL1 will be considered as the select memory cell MC and the read operation will be performed from the memory string MS0 to memory string MSi.

Results of Second Embodiment

The nonvolatile semiconductor memory device of the second embodiment can further achieve the effectiveness of (3) and (4) below, in addition to the effectiveness of (1) and (2) mentioned above.

(3) The Speed of the Read Operation can be Further Improved.

If it is the nonvolatile semiconductor memory device of this embodiment, for example, the data cache 13-2 read out command (command C2 of the first embodiment) can execute continuous read operation by recognizing the command C3 (3×h) supplied from the host device even if there is no supply during the read operation.

Namely, transfer operation of the lower page data from the latch circuit LT to the data cache 13-2 is not executed between time tr2-tr3 after receiving the command C2 at time tr1 in the first embodiment, but here as shown in FIGS. 9A and 9B (refer to FIG. 9A and FIG. 9B), if the command initially supplied is C3, automatic read data cache operation and next page read operation are enabled even if the new command is not received, making it possible to further achieve high speed read operation.

(4) Further Power Consumption Reduction can be Realized.

While reading the same memory cell MC0 during the read operation of this embodiment, the potential of the word line WL as shown in the FIG. 9A and FIG. 9B mentioned above is never returned to the initial value (for example, 0V). In other words, for example, the potential of the word line WL will not change to the initial value until the target of reading does not change from the memory cell MC0 to the memory cell MC1 at the same time as switching from the memory string MS0 to the memory string MS1.

For this reason, the amount of charge that is charged and discharged in a word line WL can be further reduced and it will be possible to reduce power consumption.

Furthermore, the command C2 may be used instead of the command C3 at time tr3, time tr7 and time tr12.

Third Embodiment

Next, a nonvolatile semiconductor memory device of the third embodiment will be explained. The read operation of the nonvolatile semiconductor memory device of the third embodiment will be explained in case the page address map of Case 2 is used in the second embodiment mentioned above (command C3). Namely, in case either the lower page or the upper page of the memory cell MC0 is selected, the memory string MS will be incremented, namely, the read operation will be performed from the memory string MS0 until the memory string MSi.

<Read Operation>

Next, the read operation of the nonvolatile semiconductor memory device of this embodiment will be explained using the timing chart of FIG. 10. Furthermore, the command and address supplied by the host device and R/BB signal are omitted here.

Figure 10:
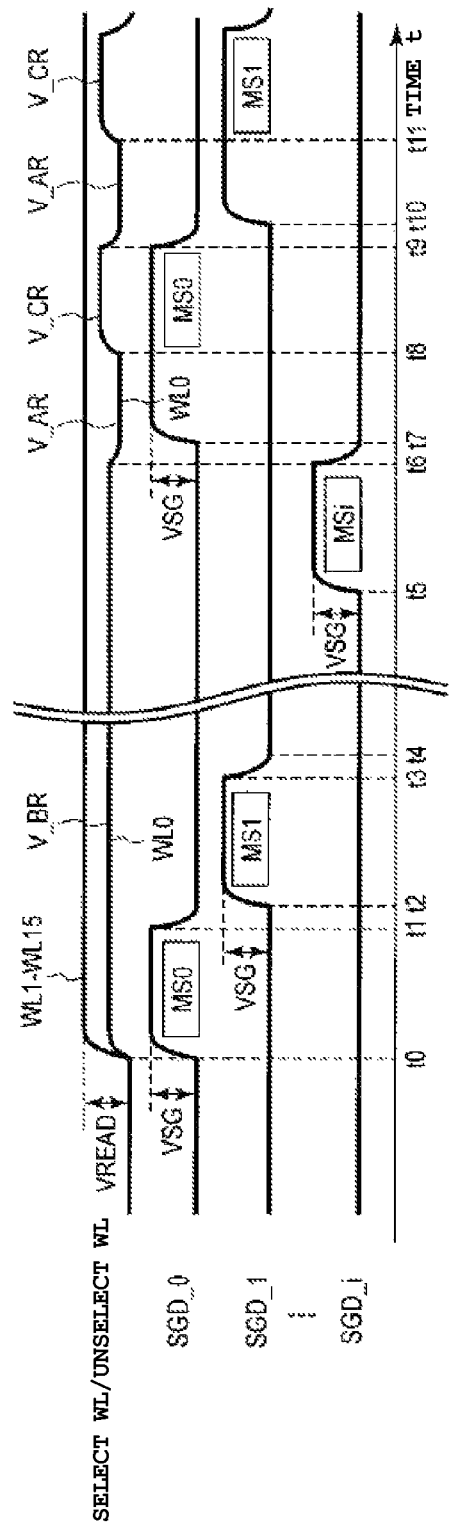
FIG. 10 is a timing chart showing a read operation of a third embodiment.

As shown in FIG. 10, time t is taken along the horizontal axis. The select word line WL, the non-selected word line WL and the voltage level of the select signals SGD_0-SGD_i supplied to the gate of the select transistor ST1 are taken along the vertical axis.

At time t0, the internal voltage generating circuit 18 supplies voltage V_BR to the select word line WL (for example, word line WL0) and voltage VREAD to the non-selected word line WL (for example, word line WL1-word line WLi). Namely, for the word line WL0 within the memory string MS0-the memory string MSi, voltage V_BR is supplied, otherwise, for the word line WL1-word line WLi, voltage V READ is supplied.

Next, at the same time t0, voltage VSG is supplied to the select signal line SGD_0 of the memory string MS0. Namely, the memory string MS0 will be in the selected state and the lower page data from the memory cell MC0 within the memory string MS0 will be read. Thereafter, the select signal line SGD_0 will be shifted to 0V at time t1.

At the same time t2, voltage VSG is supplied to the select signal line SGD_1 of the memory string MS1. Namely, the memory string MS1 will be in the selected state and the lower page data from the memory cell MC0 within the memory string MS1 will be read. Thereafter, the select signal line SGD_0 will be shifted to 0V at time t2. Below, this operation is repeated until the memory string MSi.

As described above, the nonvolatile semiconductor memory device of this embodiment is assumed to possess the page address map of Case 2. In other words, after reading the data of the memory cell MC0 from the memory string MS0-memory string MSi, namely, the read operation for the upper page data of the memory cell MC0 that have been provided within the memory string MS0-memory string MSi will be executed after time t7.

Specifically, at time t6, while the internal voltage generating circuit 18 changes the potential of the word line WL0 from voltage V_BR to voltage V_AR, at time t7, once again the select signal line SGD_0 corresponding to the memory string MS0 will be supplied with voltage VSG.

Next, at time t8, the internal voltage generating circuit 18 will change from voltage V_AR to voltage V_CR and fix the upper page data.

Thereafter, the read operation for data held in the memory cell MC0 within the memory string MS0-memory string MSi is completed, and next the read operation for the memory cell MC1 will be executed.

In other words, voltage VREAD will be applied to the word lines WL2-WLi that will be the non-selected word line WL and voltage V_BR will be applied to the select word line WL1, and the voltage VSG will be sequentially applied to the corresponding select signal line SGD_0-SGD_i depending on the input of the read cache command, and the read operation of the lower page of the memory cell MC1 within the memory string MS0-memory string MSi will be executed efficiently. Thereafter, the upper page of the memory cell MC1 will be read, and since the read operation of the memory cell MC2-memory cell MC15 is the same, the explanation has been omitted.

Results of Third Embodiment

The nonvolatile semiconductor memory device of the third embodiment can even achieve the effectiveness of the above (3) and (4).

Namely, by using the architecture with the characteristic wherein the word line WL are commonly connected within the memory string MS0-memory string MSi, for example, in case of reading the lower page data, the reading speed can be improved by switching the select signal line SGD_0-SGD_i ON and OFF while maintaining the non-selected word line WL at voltage VREAD and the select word line WL at voltage V_BR.

It is the same for the upper page data, for the select word line WL, voltage V_AR and voltage V_CR are switched, but since it is not returned to the initial value (0V) until the select word line WL is switched, it is possible to improve the read operation.

In addition, even in the embodiment mentioned above, as the potential of the select word line WL and the non-selected word line WL is not returned to the initial value (0V) until the time of switching over of the select word line WL, the quantity of charge that is charged and discharged in a word line WL is reduced, making it possible to reduce power consumption.

Fourth Embodiment

Next, the nonvolatile semiconductor memory device of the fourth embodiment will be explained. The nonvolatile semiconductor memory device of this embodiment uses a new command C4 (3Fh) for the operation explained in the above mentioned the first embodiment.

This command C4 stops the read operation of the following pages and transfers the data that has been just read to the host device through the latch circuit LT and the data cache 13-2.

<Read Operation>

Figure 11:
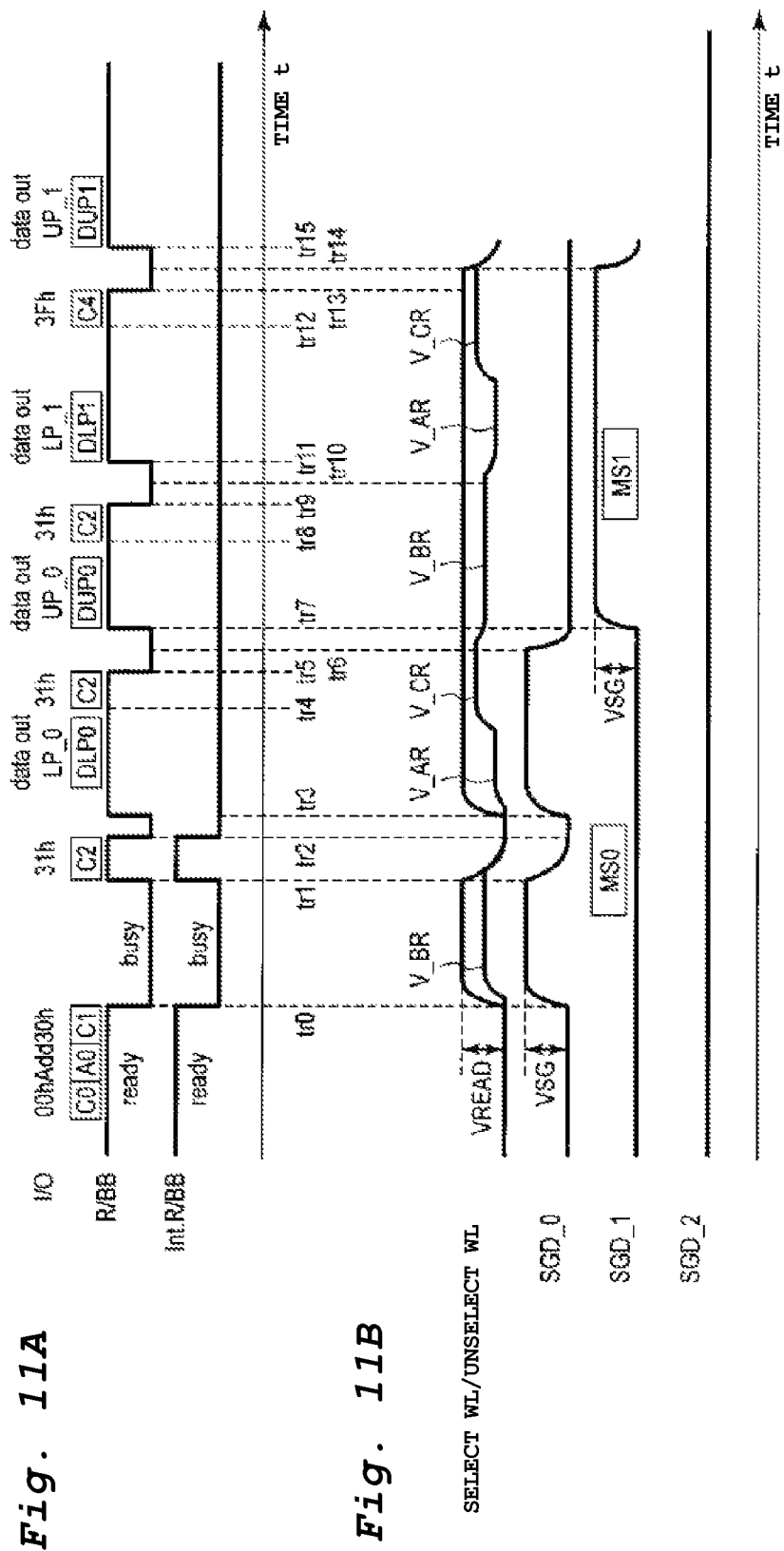
FIGS. 11A and 11B are timing charts of a read operation of a fourth embodiment.

The read operation of the nonvolatile semiconductor memory device of the fourth embodiment will be explained using FIG. 11A and FIG. 11B. FIG. 11A and FIG. 11B are the timing charts showing the read operation. Furthermore, the reading operation of this embodiment is explained. In addition, operations which are similar to FIGS. 9A and 9B have been omitted.

As shown in FIG. 11A, time t is taken along the horizontal axis, and the command and address supplied by the host device, R/BB signal showing the status of the nonvolatile semiconductor memory device to the outside, and Int. R/BB signal showing the internal state of the nonvolatile semiconductor memory device are obtained with I/O along the vertical axis. In addition, FIG. 11B is the timing chart of the voltage change of the word line WL and of the select signal, with time along the horizontal axis t, the voltage level of the selected/non-selective word line WL and the voltage level of the signal line (SGD_0, SGD_1 and SGD_2) are taken on the vertical axis.

Command C4 is supplied from the host device at time tr12. In other words, it will recognize that the control circuit 15 will not perform the read operation of the next page, and after executing the page read operation, which is under progress, until time tr14, the voltage supplied to the word line WL to stop the reading operation is returned to the initial value (0V). The data captured in the latch circuit LT of the sense amplifier 13 with the operation until time tr14 will be transferred to the data cache 13-2 until time tr15 after that.

Once the command C4 has been received, R/BB signal outputs "L", which means busy, since the data from data cache 13-2 corresponding to the command C4 has not been prepared until time tr15.

Next, the upper page data read after time tr15 (ready state) is output sequentially to the outside from the data cache 13-2 based on the clock pulse of the read enable RE.

Furthermore, if the command and address (C0 (00h), add, and C1 (30h)) are input once again from the host device, the read operation will be started according to the address of the memory cell MC and the memory string MS.

Results of Fourth Embodiment

The nonvolatile semiconductor memory device of the fourth embodiment can even achieve the effectiveness of the (1)-(3) above.

Namely, as mentioned above, it will be possible to improve the speed of reading.

Fifth Embodiment

Next, the nonvolatile semiconductor memory device of the fifth embodiment will be explained. This embodiment combines the command C4 explained above with the read operation of the second embodiment. The read operation will be explained below.

<Read Operation>

Figure 12:
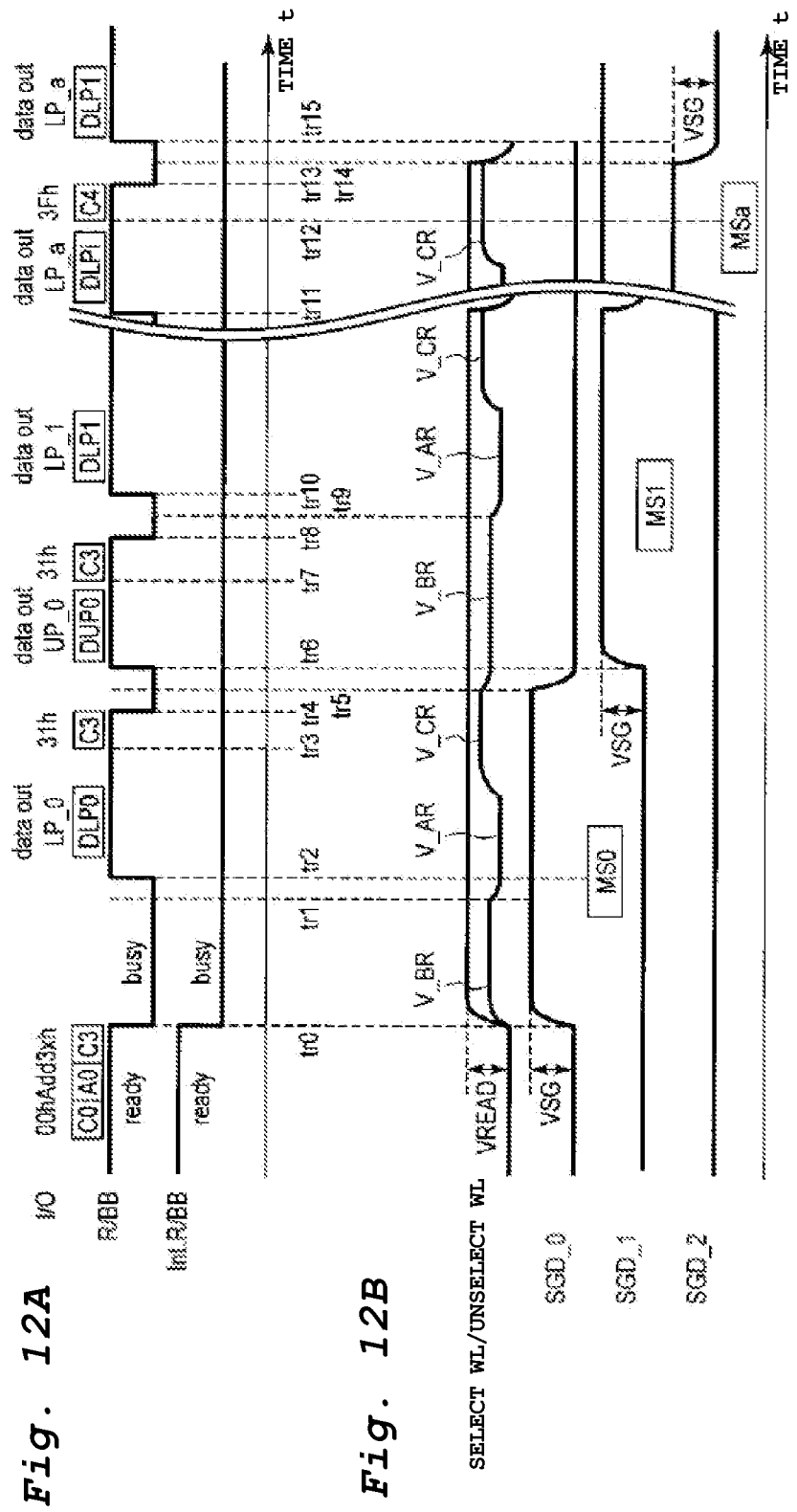
FIGS. 12A and 12B are timing charts of a read operation of a fifth embodiment.

First, the read operation of the nonvolatile semiconductor memory device of the fifth embodiment will be explained using FIG. 12A and FIG. 12B. FIGS. 12A and 12B are the timing charts showing the read operation.

Furthermore, the reading operation of this embodiment will be explained.

As shown in FIG. 12A, time t is taken along the horizontal axis, and the command and address supplied by the host device, R/BB signal showing the status of the nonvolatile semiconductor memory device to the outside, and Int. R/BB signal showing the internal state of the nonvolatile semiconductor memory device are obtained with I/O along the vertical axis.

In addition, FIG. 12B is the timing chart of the word line WL that operates based on the command and address supplied by the host device and the voltage change of the select signal, with time along the horizontal axis t, the voltage level of the selected/non-selective word line WL and the voltage level of the signal line (SGD_0, SGD_1 and SGD_2) are taken on the vertical axis. In addition, explanation of operations that is similar to FIG. 9A and FIG. 9B has been omitted.

Command C4 is supplied from the host device at time tr12. This control circuit 15 recognizes that the read operation of the next page will not be performed if the command C4 is input from the host device, and after executing the page read operation that is under progress until time tr14, the voltage supplied to the word line WL to stop the reading of the next page is returned to the initial value (0V). The data captured in the latch circuit LT of the sense amplifier 13 with the operation until time tr14 will be transferred to the data cache 13-2 unit until time tr15 after that. Once the command C4 has been received, R/BB signal outputs "L", which means busy, since the data corresponding to the command C4 has not been output until time tr15.

Next, the upper page data read after time tr15 (ready state) is output sequentially to the outside from the data cache 13-2 based on the clock pulse of the read enable RE.

Results of Fifth Embodiment

The nonvolatile semiconductor memory device of the fifth embodiment can even achieve the effectiveness of the (1)-(3) above.

Namely, as mentioned above, it will be possible to improve the speed of reading.

Sixth Embodiment

Next, a nonvolatile semiconductor memory device of the sixth embodiment will be explained. The nonvolatile semiconductor memory device of the sixth embodiment intends to reduce the read disturb by reducing the potential difference between the channel and the gate during read operation.

Next, the nonvolatile semiconductor memory device of the sixth embodiment will be explained using a timing chart. In the read operation below, for example, once the lower page data and the upper page data held in the memory cell MC0 within memory string MS are read, the read operation is executed until memory string MS15 by incrementing +1 the address of the memory string MS.

<Read Operation>

Figure 13:
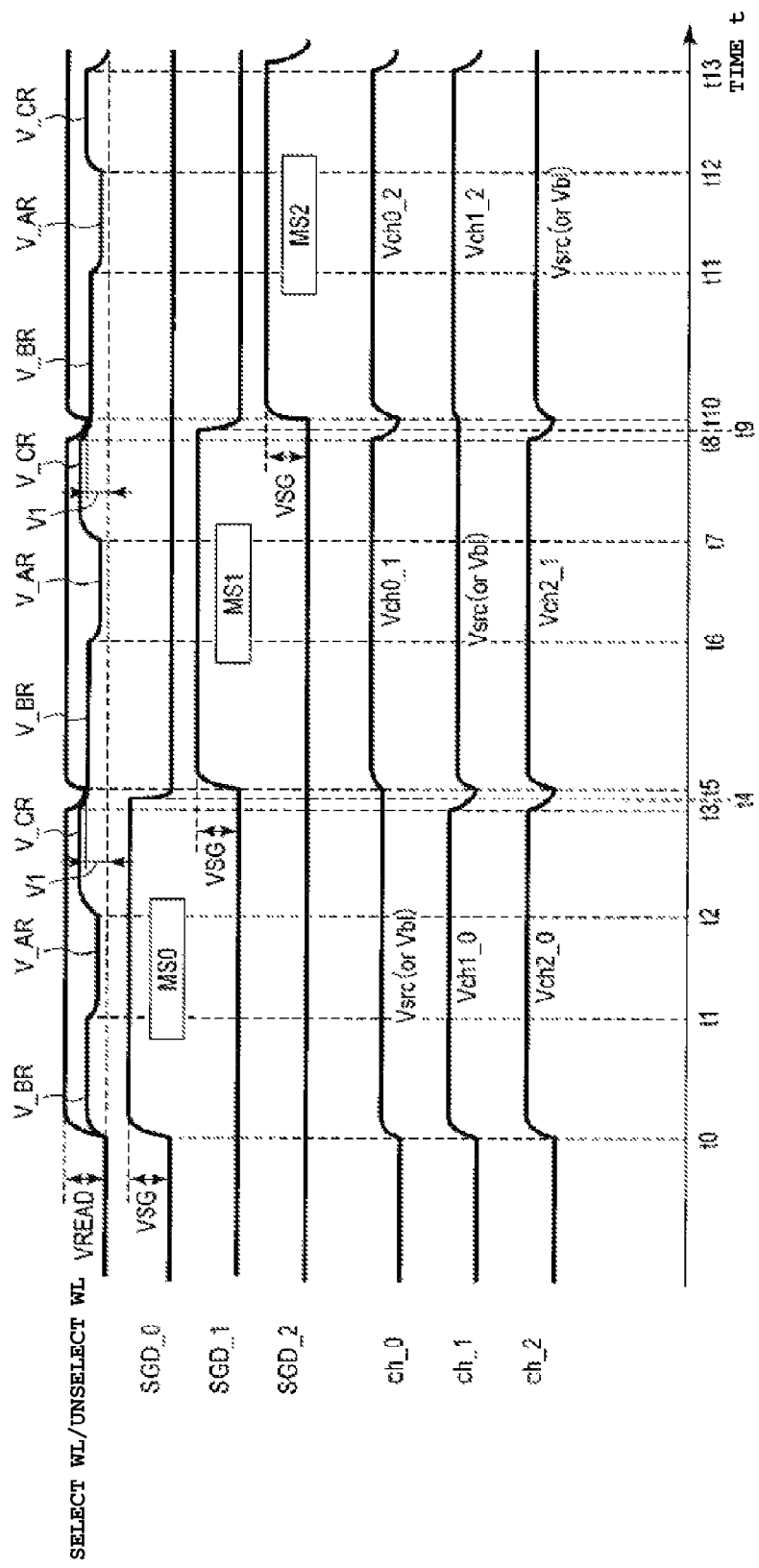
FIG. 13 is a timing chart showing a read operation of a sixth embodiment.

Read operation is explained using FIG. 13. FIG. 13 is the timing chart showing the read operation focusing on the memory string MS0-memory string MS2. As shown in the drawing, time t is taken along horizontal axis, the select word line WL and the non-selected WL, the select signal SGD_0-SGD_2 which is supplied to the drain side selection gate of select memory string MS0-memory string MS2, as well as the channel potential (in the drawing, ch_0, ch_01 and ch_2) of memory cell MC within the memory string MS0-memory string MS2 are shown along vertical axis.

Furthermore, the select word line WL0, and the rest are considered as the non-selected word lines WL1-WL15, and the memory cell MC0 will be in the ON state if voltage V_BR, voltage V_AR and voltage V_CR are supplied. Namely, the case in which the threshold distribution of the memory cell MC0 is in state E of FIG. 2 is cited as an example.

First, at time t0, the internal voltage generating circuit 18 will supply the voltage VREAD to the non-selected word lines WL1-WL 15, the voltage V_BR to the select word line WL0, and the voltage VSG to the select signal line SGD_0 via the core driver 19.

With this, the memory string MS0 will be in the selected state, the potential of channel ch_0 will rise to near the voltage (voltage Vbl or voltage Vsrc) supplied to the bit line BL (or the source line SL).

Therefore, the upper page data held by the memory cell MC0 within the memory string MS0 is read out.

Furthermore, 0V is applied as the voltage for the non-selection to the select signal SGD_1 and SGD_2 corresponding to the memory strings MS1 and MS2, and the select transistors ST_1 and ST_2 are both switched OFF. For this reason, both channels ch_1 and ch_2 with the elevation of the potential of the non-selected word line WL1-WL15 are boosted by coupling to near the voltage VREAD (referred to as Vch1_0 and Vch2_0 in the drawing).

Thereafter, during time t1-t3, the internal voltage generating circuit 18 will supply voltage V_CR and voltage V_AR to the select word line WL0. With this, the reading of the upper page data held by the memory cell MC0 within the memory string MS0 will be completed.

Thereafter, at time t3, voltage VREAD that is applied to the non-selected word lines WL1-WLi is discharged and it will reduce to voltage V1 by time t4. Along with this, the potential of ch_1 and ch_2, which is boosted until time t3, will reduce to the potential of around the voltage V1 in response to the decrease in potential of the non-selected word line.

In addition, the potential of the select signal line SGD_0 is maintained at voltage VSG until time t4, after which it is discharged. As a result, the potential of Ch_0, which is the selection string from time t0 to t4, will be approximately equal to the potential of the bit line BL or the source line SL. Therefore, the select signal SGD_0 is at 0V until time t5, and the select transistor ST0 will be in the OFF state.

Next, at time t5, the internal voltage generating circuit 18 will once again change the potential of the non-selected word lines WL1-WLi from voltage V1 to voltage VREAD via the core driver 19. Here, the channel ch_0 will be in the floating state since the select signal line SGD_0 is in the OFF state, and the potential of channel ch_0 will be boosted along with the rise in the non-selected word lines WL1-WLi potential. The potential of the channel ch_0 will be the potential of the bit line BL or the source line SL to which (VREAD-V1) has been added (it is referred to as Vch0_1 in the drawing).

At the same time t5, the internal voltage generating circuit 18 supplies voltages VSG to the select signal line SGD_1 corresponding to the memory string MS1 via the core driver 19, and the select transistor ST_1 is switched ON. In other words, the memory string MS1 will be the target for reading, namely it will be in the selected state.

Therefore, the potential of the channel ch_1 will be the potential supplied by either bit line BL or source line SL (in the drawing, voltage Vbl or voltage Vsrc).

In addition, the potential of ch_2 corresponding to the memory string MS2 will rise to near voltage VREAD due to boosting in the same way between time t0-time t3 (in the drawing, voltage Vch2_1).

The read operation of the lower page data and the upper page data held by the memory cell MC0 within the memory string MS1 will be executed between time t5-time t8.

Once time t8 has passed, once again the potential of the non-selected word lines WL1-WLi is discharged, and it is lowered to voltage V1 at time t10. The potential of the select signal line SGD_1 will become voltage VSG until time t9 while the potential of the non-selected word lines WL1-WLi is lowered. Voltage VSG is maintained until time t9 for this too, with the same reason as in the case of the select signal line SGD_0.

As the read operation of the lower page data and the upper page data held by the memory cell MC0 within the memory string MS1 is completed until time t8, next the address of the memory string MS is incremented by 1.

Namely, after time t10, the memory string MS2 will be the target for reading. Furthermore, since the read operation of the memory string MS2 is the same as the above mentioned memory cell MC0 and memory string MS1, the explanation has been omitted.

Above, explanation has been given focusing on the read operation of the memory cell MC0 of the memory string MS0-memory string MS2, the same kind of operation is executed for the memory string MS3-memory string MS15. Furthermore, it is the same for the gate of the memory cell MC1-memory cell MC15, which are provided within the memory string MS0-memory string MSi.

Results of Sixth Embodiment

The nonvolatile semiconductor memory device of the sixth embodiment can achieve the effectiveness of (5) below.
(5) It is Possible to Mitigate Read Disturb.

Namely, according to the nonvolatile semiconductor memory device of the sixth embodiment, at the time of switching the memory string MS, which is the target of reading, the internal voltage generating circuit 18 reduces the potential of the non-selected word line WL1-WL15 from voltage VREAD to Voltage V1 and then increases it to voltage VREAD again.

In addition, when the non-selected word lines WL1-WL15 drop to voltage V1, the drop in potential of the channel with the drop of the potential of the non-selected word lines WL1-WL15 is prevented by switching the select transistor ST of the memory string that is previously selected to ON state.

For this reason, after the memory string MS, which is the target of reading, is incremented, and when the potential of the non-selected WL is raised from voltage V1 to voltage VREAD once again, the potential of the channel within the memory string MS, which has been switched to the non-selected memory string MS, can be increased by a specific amount from the potential of the bit line or the source line by coupling with the non-selected word line WL.

In case this kind of control is not performed, in the memory string MS, which has been selected once, and in the read operation after the memory string MS has been switched, the potential of the channel within the memory string MS is the same potential as in the case of the select memory string MS, in other words, it will be approximately equal to the bit line BL and the source line SL, the potential difference, which is the same as the select memory string MS, will be applied to the non-selected word line WL and the channel portion.

Namely, the potential difference between the voltage VREAD applied to the non-selected word line WL and the voltage applied to the bit line BL and the source line SL, which is in the process of being read, continues to be applied to the cell of the memory string MS, which is in the non-selected state.

As a result, weak writing direction, in other words, the number of times the stress of shifting direction to increase the threshold voltage of memory cell MC in erased state applied increases.

In other words, it is possible to mitigate the read disturb due to the potential difference between the non-selected word line WL and the channel.

In the above first to sixth embodiments, read operation focusing on the memory string MS1-memory string MSi with respect to the bit line BL0 has been explained, and the actual read operation performs the same kind of read operation for bit line BLi-bit line BLm.

The read operation of data may read the entire bit line BL simultaneously, or follow a method to read the bit line BL (single or multiple) randomly depending on the column address. In addition, in case the bit lines BL0, BL1 are made a pair and the bit lines BL2, BL3 are made a pair, it may execute the reading operation alternately between these pairs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device, comprising:
 a memory cell array including a plurality of blocks, one of the blocks including a first memory string and a second memory string, the first memory string including first memory cells and a first select transistor, the second memory string including second memory cells and a second select transistor;
 a plurality of word lines commonly connected to the first memory string and the second memory string; and a control unit configured to perform a first read operation and a second read operation sequentially when the memory device receives a command and an address, the address including a word line address, a string address, and a block address, wherein a first voltage is applied to a selected word line and a second voltage is applied to non-selected word lines during the first and second read operations without discharging either of the first or second voltages, and wherein the first select transistor is turned on when the first memory string is selected and the second select transistor is turned on when the second memory string is selected.

2. The memory device according to claim 1, wherein the memory device receives an address after receiving a first command, and the memory device executes the first read operation for the address after receiving a second command.

3. The memory device according to claim 2, wherein the memory device is configured to output a busy signal after receiving the first command, the address, and the second command.

4. The memory device according to claim 3, wherein the memory device executes the second read operation for an address which is different from the address received after the first command when the memory device receives a third command.

5. The memory device according to claim 4, wherein the memory device is capable of outputting data of the first read operation when the memory device outputs a ready signal after receiving the third command.

6. The memory device according to claim 5, wherein the memory device outputs a busy signal when the memory device receives the third command again.

7. The memory device according to claim 6, wherein the memory device is configured to discharge the first or second voltages when the memory device receives a fourth command while outputting the ready signal.

8. The memory device according to claim 7, wherein the address includes an address of a lower page or upper page.

9. The memory device according to claim 7, wherein the control unit is configured to perform an erase operation per block.

10. The memory device according to claim 4, wherein the memory device changes an address to be accessed when the memory device receives the third command.

11. The memory device according to claim 4, wherein the memory device changes a page address to be accessed when the memory device receives the third command, the page address including a lower page address and an upper page address.

12. A memory device, comprising:
a memory cell array including a plurality of blocks, one of the blocks including a first memory string and a second memory string, the first memory string including first memory cells and a first select transistor, the second memory string including second memory cells and a second select transistor, a plurality of word lines commonly connected to the first memory string and the second memory string; and a control unit configured to perform a first read operation and a second read operation sequentially when the memory device receives a command, wherein a first voltage is applied to a selected word line and a second voltage is applied to non-selected word lines during the first and second read operations without discharging either of the first or second voltages, and wherein the first select transistor is turned on when the first memory string is selected and the second select transistor is turned on when the second memory string is selected.

13. The memory device according to claim 12, wherein the memory device receives an address after receiving a first command, and the memory device executes the first read operation for the address after receiving a second command.

14. The memory device according to claim 13, wherein the memory device is configured to output a busy signal after receiving the first command, the address, and the second command.

15. The memory device according to claim 14, wherein the memory device executes the second read operation for an address which is different from the address received after the first command when the memory device receives a third command.

16. The memory device according to claim 15, wherein the memory device is capable of outputting data of the first read operation when the memory device outputs a ready signal after receiving the third command.

17. The memory device according to claim 16, wherein the memory device outputs a busy signal when the memory device receives the third command again.

18. The memory device according to claim 17, wherein the memory device is configured to discharge the first or second voltages when the memory device receives a fourth command while outputting the ready signal.

19. The memory device according to claim 15, wherein the memory device changes an address to be accessed when the memory device receives the third command.

20. The memory device according to claim 15, wherein the memory device changes a page address to be accessed when the memory device receives the third command, the page address including a lower page address and an upper page address.

* * * * *